US010103002B1

(12) United States Patent
Gamm et al.

(10) Patent No.: US 10,103,002 B1
(45) Date of Patent: Oct. 16, 2018

(54) METHOD FOR GENERATING AN IMAGE OF AN OBJECT AND PARTICLE BEAM DEVICE FOR CARRYING OUT THE METHOD

(71) Applicant: Carl Zeiss Microscopy GmbH, Jena (DE)

(72) Inventors: Bjoern Gamm, Koenigsbronn (DE); Pascal Frank, Essingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/159,842

(22) Filed: May 20, 2016

(51) Int. Cl.
*H01J 37/00* (2006.01)
*H01J 37/22* (2006.01)
*H01J 37/28* (2006.01)
*H01J 37/244* (2006.01)
*H01J 37/147* (2006.01)

(52) U.S. Cl.
CPC ........ *H01J 37/222* (2013.01); *H01J 37/1474* (2013.01); *H01J 37/244* (2013.01); *H01J 37/28* (2013.01); *H01J 2237/21* (2013.01); *H01J 2237/2806* (2013.01)

(58) Field of Classification Search
CPC .... H01J 37/222; H01J 37/1474; H01J 37/244; H01J 37/28; H01J 2237/21; H01J 2237/2806
USPC ........................................ 250/306, 307, 310
See application file for complete search history.

(56) References Cited

U.S. PATENT DOCUMENTS

| 6,855,929 B2* | 2/2005 | Kimba ................. G01N 23/225 250/307 |
| 2006/0226362 A1 | 10/2006 | Kitsuki et al. |
| 2014/0070095 A1* | 3/2014 | Schoenmakers ..... G01N 23/046 250/305 |

* cited by examiner

*Primary Examiner* — Nicole Ippolito
*Assistant Examiner* — Hanway Chang
(74) *Attorney, Agent, or Firm* — Muirhead and Saturnelli, LLC

(57) ABSTRACT

The invention relates to a method for generating an image of an object (114) using a particle beam device (100) generating a beam of charged particles. Moreover, the invention relates to a particle beam device (100) for carrying out this method. In particular, the particle beam device (100) is an electron beam device and/or an ion beam device. The method comprises selecting a desired value of a depth of field from a plurality of values of the depth of field by a user, wherein each value of the plurality of values of the depth of field is associated with a specific resolution of the particle beam device (100), the specific resolution being achieved when using the desired value of the depth of field. Moreover, the method comprises adjusting the depth of field to the desired value of the depth of field by controlling at least one of: (i) a condenser lens (105, 106), (ii) a relative position of the object (114) to an objective lens (107) and (iii) a position of an aperture unit (108, 109) and/or a size of an aperture unit opening (108A, 118), and imaging the object (114) with the desired value of the depth of field and with the specific resolution associated with the value of the depth of field.

22 Claims, 13 Drawing Sheets

METHOD FOR GENERATING AN IMAGE OF AN OBJECT AND PARTICLE BEAM DEVICE FOR CARRYING OUT THE METHOD

TECHNICAL FIELD

The invention relates to a method for generating an image of an object using a particle beam device generating a beam of charged particles. Moreover, the invention relates to a particle beam device for carrying out this method. In particular, the particle beam device is an electron beam device and/or an ion beam device.

BACKGROUND OF THE INVENTION

Particle beam devices are used for analyzing and examining objects (hereinafter also called samples) in order to obtain insights with regard to the properties and behavior of the objects under specific conditions. One of those particle beam devices is an electron beam device, in particular a scanning electron microscope (also known as SEM).

In an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

The interaction radiation comprises X-rays and/or cathodoluminescence light and may be detected with a radiation detector. When measuring X-rays with the radiation detector, in particular energy-dispersive X-ray spectroscopy (also known as EDS or EDX) may be carried out. EDX is an analytical analysis method used for the elemental analysis or chemical characterization.

An ion beam device is also known from the prior art. The ion beam device comprises an ion beam column having an ion beam generator. Ions are generated which are used for processing a sample (for example for removing a layer of the sample or for depositing material on the sample, wherein the material is provided by a gas injection system) or else for imaging.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column as mentioned above. The SEM serves, in particular, for observing the processing, but also for further analysis of the processed or non-processed sample. Electrons may also be used for depositing material. This is known as electron beam induced deposition (EBID).

Images generated using a particle beam device, for example an SEM, may have a depth of field. FIG. 1 shows a drawing for further explanation of the depth of field of an image generated using the SEM. Reference sign 1000 denotes a primary electron beam which is focused by an objective lens 1001 onto an object 1002 arranged in an object plane. The primary electron beam 1000 is guided through an opening of an aperture unit 1003. The depth of field DOF is the distance area which is imaged as a sharp image. Therefore, features of the object being arranged in this distance area are in sharp focus and are clearly shown in the image generated using the SEM.

The depth of field DOF may be adjusted in the SEM, for example, by adjusting the working distance WD, which is the distance between the objective lens 1001 and the object plane of the object 1002 and/or by adjusting the opening of the aperture unit 1003. A large depth of field DOF may be obtained using a small opening of the aperture unit 1003, whereas a small depth of field DOF may be obtained using a large opening of the aperture unit 1003. Moreover, a large depth of field DOF may be obtained using a large working distance WD, whereas a small depth of field DOF may be obtained using a small working distance WD.

The angle $\alpha$ shown in FIG. 1 is the angle of aperture. By reducing the angle of aperture, the depth of field DOF is increased. A small angle of aperture, however, would increase the diameter of the primary electron beam due to a diffraction effect of the aperture unit and deteriorate the image resolution of the SEM. Therefore, the depth of field DOF and the diameter of the primary electron beam (and thus the resolution of the particle beam device in the generated image) are in trade-off relation to each other. If the DOF is increased, the resolution of the particle beam device is decreased. Accordingly, if the DOF is decreased, the resolution of the particle beam is increased. The angle of aperture may be adjusted using a condenser unit, as explained further below.

As to the prior art, an SEM is known comprising two condenser units, namely a first condenser unit and a second condenser unit. Each of the first condenser unit and the second condenser unit may be a condenser lens. The depth of field of the images generated using this known SEM is adjustable to a first value and to a second value. If the depth of field is adjusted to the first value, the SEM is operated in a first operation mode. If the depth of field, however, is adjusted to the second value of the depth of field, the SEM is operated in a second operation mode. The first operation mode is the so-called high resolution mode which provides for a high resolution of the image, for example 1 nm. However, the first operation mode provides only for a low depth of field (for example 12 µm). The second operation mode provides for a large depth of field (for example 300 µm). However, the resolution of the image is quite low (for example 3 to 4 nm). Since this SEM known from the prior art provides only for two values of depth of field, the depth of field in the image may fail to meet certain user's needs.

A further SEM for digitally processing an image signal to secure the largest focal depth and the best resolution in accordance with the magnification for observation is also known from the prior art. The known SEM comprises a sample holder for holding a sample, an electron beam source, a plurality of convergence lenses for converging the electron beam emitted from the electron beam source, an objective lens for radiating the converged electron beam as a micro spot on a sample, a scanning coil for scanning the electron beam on the sample, a detector for detecting the sample signal generated from the sample irradiated with the electron beam, an analog-to-digital converter (hereinafter also referred to as A/D converter) for converting the analog detection signal of the detector to a digital signal, a storage unit for storing the digital signal converted by the A/D converter as an image signal, and a display unit for displaying an image associated with the image signal stored in the storage unit. The A/D converter is adapted to switch the number of pixels per screen by changing the sampling rate, and the angle of aperture of the electron beam is changed in accordance with the pixel size (visual field area per pixel) determined in accordance with the number of pixels per screen. The angle of aperture of the electron beam is changed by controlling the convergence lenses and is set in such a manner as to realize the best resolution as determined by the pixel size of the image displayed on the display unit and the largest depth of field for the particular resolution.

This known SEM provides for an adjustable depth of field which is calculated based on data stored in the storage unit. However, the depth of field is only realized with the best possible resolution and, therefore, may not be freely adjusted to provide an image of an object as desired by a user.

As regards prior art, reference is made in particular to US 2006/0226362 A1.

In light of the aforesaid, it is desirable to provide a method for generating an image of an object and a particle beam device for carrying out the method which provide a possibility of selecting a depth of field of the image according to the user's needs.

SUMMARY OF THE INVENTION

A method according to the invention is used for generating an image of an object using a particle beam device. The particle beam device may be an electron beam device and/or an ion beam device. The particle beam device may comprise a particle beam generator for generating a particle beam having charged particles. The charged particles may be electrons and/or ions. Moreover, the particle beam device may comprise at least one detector for detecting interaction particles and/or interaction radiation, the interaction particles and the interaction radiation arising from the interaction of the particle beam with the object when the particle beam impinges on the object. The detector generates detection signals based on the detected interaction particles and/or interaction radiation. The interaction particles may be secondary particles, for example secondary electrons, or backscattered particles, for example backscattered electrons. The interaction radiation may be X-rays or cathodoluminescence light. Moreover, the particle beam device may comprise a raster device for deflecting the particle beam over the object, for example in a raster-type fashion. Furthermore, the particle beam device may comprise at least one display unit for displaying the image of the object and/or an image of data of the object, for example an X-ray spectrum, using the detection signals.

Moreover, the particle beam device may have at least one of the following: (i) at least condenser lens for guiding the particle beam in the particle beam device, (ii) at least one object holder for holding the object and (iii) at least one aperture unit comprising at least one aperture unit opening for shaping (forming) and/or limiting the particle beam.

The method according to the invention comprises the step of selecting a desired value of the depth of field from a plurality of values of the depth of field by a user, wherein each value of the plurality of values of the depth of field is associated with a specific resolution of the particle beam device, the specific resolution being achieved when using the desired value of the depth of field for imaging of the object. Therefore, a user selects the desired value of the depth of field according to the user's needs. The method according to the invention also comprises the step of adjusting the depth of field to the desired value of the depth of field by controlling at least one of: (i) the condenser lens, (ii) a relative position of the object to the objective lens and (iii) a position of the aperture unit and/or a size of the aperture unit opening.

The condenser lens is controlled in particular by adjusting an excitation of the condenser lens. It is additionally or alternatively provided in a further embodiment of the invention that the relative position of the object to the objective lens is controlled by moving the object holder and/or the objective lens. For example, the object holder is movable in a direction parallel to an optical axis of the particle beam device. In a further embodiment of the invention, the object holder may be movable along three axes which are arranged to be mutually perpendicular (specifically an x-axis, a y-axis and a z-axis). Furthermore, the object holder may be rotated about two rotation axes which are arranged to be mutually perpendicular. It is therefore possible to move the object to a desired position. It is additionally or alternatively provided in a further embodiment that the aperture unit may be movable along at least one axis. For example, the aperture unit may be movable along three axes which are arranged to be mutually perpendicular. It is additionally or alternatively provided in a further embodiment of the invention that the aperture unit opening may have an adjustable size. It is also additionally or alternatively provided in a further embodiment of the invention that the aperture unit may have several aperture unit openings, each being of a different size. When moving the aperture unit, a specific aperture unit opening having a specific size may be chosen for shaping (forming) and/or limiting the particle beam of the particle beam device.

Furthermore, the method according to the invention comprises the step of imaging the object with the desired value of the depth of field and with the specific resolution associated with the desired value of the depth of field.

The method according to the invention is based on the idea that a user selects a desired value of a depth of field to be obtained when imaging an object. The user selects the desired value of the depth of field regardless of the quality of the resolution. Therefore, the user does not select the desired value of the depth of field in such a manner as to realize the best resolution. Instead, the image of the object is generated with the desired value of the depth of field and the specific resolution which is associated with the desired value of the depth of field and is inherently given by the operation mode of the particle beam device. The specific resolution may have any value in the range of 0.5 nm to 10 nm.

It is additionally or alternatively provided in embodiments of the method according to the invention that the particle beam device used for generating the image of the object is controlled in such a way that specific image properties are given. Examples of the image properties are discussed further below. These embodiments are based on the idea that adjusting the depth of field to the desired value of the depth of field as mentioned above may change the image properties, since, for example, a change of characteristics of the condenser lens or the position of the aperture unit has an effect on the form and path of the particle beam, which ultimately also affect image properties such as the focus of the particle beam onto the object and the magnification of the particle beam device. Therefore, these embodiments of the method according to the invention provide for achieving specific image properties selected by a user.

For example, it is additionally or alternatively provided in an embodiment of the method according to the invention that the objective lens is adjusted in such a way that the image of the object remains in focus when adjusting the depth of field to the desired value of the depth of field. In particular, a current of a coil of the objective lens is controlled in such a way that the image of the object remains in focus when adjusting the depth of field to the desired value of the depth of field. This exemplary embodiment of the invention is in particular used when the depth of field is adjusted by controlling the condenser lens and/or the relative position of the object to the objective lens.

Furthermore, it is additionally or alternatively provided in an embodiment of the method according to the invention that the method includes adjusting the raster device to achieve a first amount of deflection of the particle beam to obtain a specific magnification of the particle beam device. This adjusting is carried out before adjusting the depth of field to the desired value of the depth of field as mentioned above. Therefore, before adjusting the depth of field to the desired value of the depth of field, a user may select a specific magnification of the particle beam device such that the image of the object is generated with such specific magnification. This embodiment of the method according to the invention also provides for adjusting the raster device to achieve a second amount of deflection of the particle beam to maintain the specific magnification of the particle beam device after having adjusted the depth of field to the desired value of the depth of field as mentioned above.

It is additionally or alternatively provided in a further embodiment of the method according to the invention that the raster device is adjusted to achieve a specific rotation of the particle beam with respect to an optical axis of the particle beam device before adjusting the depth of field to the desired value of the depth of field as mentioned above. This specific rotation of the particle beam is based on the following. The particle beam device may have an electronic scan rotation feature that permits to orient the image on the display unit to any position through a rotation up to 360°. Scan rotation changes the orientation of a scanned field of the object. A scan rotation may be achieved using a scan rotation unit which rotates the scanned field in its own plane around the optical axis of the particle beam device. After having adjusted the depth of field to the desired value of the depth of field as mentioned above, the raster device is re-adjusted to maintain the specific rotation of the particle beam with respect to the optical axis. Therefore, the raster device is re-adjusted in such a way that the specific scan rotation is maintained.

Furthermore, it is additionally or alternatively provided in a further embodiment of the method according to the invention that the particle beam device used for carrying out the method according to the invention comprises additional features. In particular, the particle beam device may comprise at least one guiding unit for guiding the particle beam to the object. The guiding unit may be any unit for guiding the particle beam to the object as well as a unit for forming the particle beam which is guided to the object. The guiding unit may be, for example, the objective lens for focusing the particle beam onto the object, an electrostatic unit and/or a magnetic unit for forming the particle beam and/or for guiding the particle beam, such as a stigmator, a condenser unit and/or an adjustable aperture unit. Moreover, the particle beam device used for carrying out the method according to the invention may also comprise at least one control unit for controlling the guiding unit and at least one storage unit comprising values of a control parameter for adjusting the control unit. The embodiment of the method according to the invention also comprises the step of reading out of the storage unit the value of the control parameter associated with the desired value of the depth of field. Furthermore, the control unit is adjusted using the value of the control parameter. The control parameter may be, for example, a physical quantity, in particular a control current or a control voltage. Additionally or alternatively, the control parameter may also be, for example, the proportion of physical quantities. The value of the physical quantity may be used for adjusting the control unit, and the control unit may then be used for controlling the guiding unit of the particle beam device in such a way that desired physical effects are achieved, for example a generation of a specific magnetic field and/or of a specific electrostatic field. Examples of the control parameter are explained further below.

A first control parameter for adjusting the control unit or a first control unit may control a contrast in the image generated using the particle beam device. The contrast is substantially the difference in brightness (and, therefore, the difference in intensity) of the brightest pixel in the image with maximum luminance $L_{max}$ and the darkest pixel in the image with minimum luminance $L_{min}$. The contrast may be given, for example, by the so-called Weber-contrast or by the Michelson-contrast. The Weber-contrast is given by:

$$K_W = \frac{L_{max}}{L_{min}} - 1 \text{ with } 0 \leq K_W \leq \infty \quad [1]$$

The Michelson-contrast is given by:

$$K_M = \frac{L_{max} - L_{min}}{L_{max} + L_{min}} \text{ with } 0 \leq K_M \leq 1 \quad [2]$$

The contrast generated substantially by secondary particles, for example secondary electrons, is mostly influenced by the topography of the surface of the object. The contrast, however, which is substantially generated by backscattered particles, for example backscattered electrons, is substantially influenced by the material of the imaged area of the object. The contrast may be increased if an amplification factor of an amplifier of the detector is increased, wherein the detector is used for detecting secondary particles and/or backscattered particles. The amplifier amplifies the detection signal generated by the detector. Similarly, the contrast may be decreased if the amplification factor of the amplifier is decreased.

A second control parameter for adjusting the control unit or a second control unit may be used for controlling the brightness in the generated image of the object. The brightness in the image is referred to each pixel of the image. A first pixel with a higher brightness value is shown brighter in the image than a second pixel having a lower brightness value. Controlling the brightness may be effected, for example, by controlling an amplification factor of the detection signal of the detector. The brightness of each pixel in the image is increased or decreased identically.

A third control parameter for adjusting the control unit or a third control unit may be used, for example, for controlling the objective lens which focuses the particle beam onto the object.

A fourth control parameter for adjusting the control unit or a fourth control unit may be used for alignment of the particle beam in the objective lens. The fourth control parameter may be used, for example, for adjusting electrostatic and/or magnetic units of the particle beam device which are used for aligning the particle beam in the objective lens.

A fifth control parameter for adjusting the control unit or a fifth control unit may be used for controlling and/or adjusting electrostatic and/or magnetic deflection units which are used for a so-called beam shift in a particle beam device. The beam shift enables adjusting the position of the scanned field of the object scanned using the raster device, and moving the scanned field to a specific position if required. This is achieved without moving a movable stage on which the object is arranged in the particle beam device. If the scanned field is moved out of the actual area of the object which should be imaged with the particle beam device due to changes of the properties of the particle beam device, a beam shift using translation movements of the particle beam is used in such a way that the scanned field is arranged again in the desired area imaged with the particle beam device.

A sixth control parameter for adjusting the control unit or a sixth control unit may be used to adjust a stigmator of the particle beam device. The stigmator is a magnetic and/or an electrostatic multipole element which is, in particular, used for correction of astigmatism.

A seventh control parameter for adjusting the control unit or a seventh control unit may be used for controlling the position of a mechanically adjustable unit of the particle beam device such as a aperture unit used for forming and limiting the particle beam in the particle beam device, in particular the aperture unit as above mentioned.

It is additionally or alternatively provided in a further embodiment of the method according to the invention that the particle beam device used for carrying out the method according to the invention also comprises at least one guiding unit for guiding the particle beam device to the object. The guiding unit may be any unit of the particle beam device as mentioned above. Furthermore, the particle beam device used for carrying out the method according to the invention may also comprise at least one control unit for controlling the guiding unit by adjusting the control unit using a control parameter. The control parameter may be any control parameter as already mentioned above. The embodiment of the method according to the invention may comprise the step of selecting a first desired value of the depth of field from the plurality of values of the depth of field by a user. Moreover, a first value of the control parameter is adjusted in such a way that a first image of the object with a desired image quality is achieved. In other words, the first value of the control parameter is adjusted in such a way that the image of the object is generated with such a good image quality that the user may sufficiently analyze the object by using information comprised in the obtained image. The image quality may be determined using objective or subjective criteria. For example, using objective criteria, the image quality of an image improves if the resolution in the image or the contrast is increased. The image quality in an image of an object may also be determined using a signal-to-noise ratio. A signal-to-noise ratio in the range of 0 to 5 may be not sufficient. However, a good signal-to-noise ratio (and, therefore, also good image quality) may be achieved if the signal-to-noise ratio is in the range of 20 to 40. Alternatively, the image quality may be determined using subjective criteria. Using subjective criteria, the user individually assesses whether the obtained image quality is sufficient or not. However, it may very well be that the image quality being assessed as sufficient by a first user is assessed as not being sufficient by a second user.

The above mentioned steps of selecting a desired value of the depth of field and adjusting a value of the control parameter for which an image of the object with a desired image quality is achieved are repeated at least once according to the embodiment of the method according to the invention. Therefore, this embodiment comprises the step of selecting a second desired value of the depth of field from the plurality of values of the depth of field by a user and the step of adjusting a second value of the control parameter for which a second image of the object with the desired image quality is obtained.

This embodiment of the method according to the invention also comprises the step of determining a functional relationship between the first value of the control parameter and the second value of the control parameter dependent on the plurality of values of the depth of field. The functional relationship may be a linear relationship or a non-linear relationship. The functional relationship may also comprise a discontinuous function or may be a discontinuous function. The functional relationship may be determined using any kind of suitable determination methods. The determination of the functional relationship may be carried out, for example, using interpolation. Any kind of interpolation may be used, for example linear interpolation, non-linear interpolation, trigonometric interpolation, logarithm interpolation and/or spline interpolation. Additionally and/or alternatively it is provided that the determination of the functional relationship is carried out using extrapolation. Any kind of extrapolation method may be used, for example linear extrapolation, non-linear extrapolation, trigonometric extrapolation and/or logarithm extrapolation. Additionally or alternatively, the determination of the functional relationship may be carried out using average determination, determination of random values and/or determination of a minimum value and/or a maximum value of two values.

When the functional relationship is determined, it is possible, for each desired value of the depth of field, to select the corresponding and associated value of the control parameter based on the determined functional relationship. Therefore, the value of the control parameter associated with the desired value of the depth of field is selected using the determined functional relationship. Moreover, the method according to the invention also comprises the step of controlling the guiding unit by adjusting the control unit using the selected value of the control parameter.

The functional relationship may be determined using more than two values of the control parameter. In particular an embodiment of the method according to the invention provides additionally or alternatively that a plurality of values of the control parameter is determined for which the image of the object with a desired image quality is achieved. In particular, more than three values of the control parameter, more than eight values of the control parameter or more than ten values of the control parameter are used.

The invention also refers to a computer program product comprising a program code which may be loaded or is loaded into a processor and which, when being executed, controls a particle beam device in such a way that a method comprising at least one of the above mentioned or further below mentioned features or a combination of at least two of the above mentioned or further below mentioned features is carried out.

The invention also refers to a particle beam device for analyzing an object. The particle beam device may comprise at least one particle beam generator for generating a particle beam comprising charged particles. The charged particles may be electrons and/or ions. Moreover, the particle beam device may also have at least one objective lens for focusing the particle beam onto the object. The objective lens may be the guiding unit. Furthermore, the particle beam device may have a raster device for deflecting the particle beam over a surface of the object in a raster-type fashion. The particle beam device may also comprise at least one detector for detecting interaction particles and/or interaction radiation, the interaction particles and the interaction radiation arising when the particle beam impinges on the object. The detector generates detection signals. The interaction particles may be secondary particles and/or backscattered particles, in particular secondary electrons and backscattered electrons. The interaction radiation may be X-rays and/or cathodoluminescence light. Moreover, the particle beam device may comprise a display unit for displaying the image of the object, wherein the image is generated using the detection signals. Moreover, the particle beam device may have at least one of the following: (i) at least one condenser lens for guiding the particle beam in the particle beam device, (ii) at least one object holder for holding the object and (iii) at least one aperture unit comprising at least one aperture unit opening for shaping (forming) and/or limiting the particle beam. Furthermore, the particle beam device comprises at least one processor into which a computer program product as mentioned above is loaded.

It is additionally or alternatively provided in a further embodiment of the invention that the objective lens and/or the object holder are/is movable. For example, the object holder is movable in a direction parallel to an optical axis of the particle beam device. In a further embodiment of the invention, the object holder may be movable along three axes which are arranged to be mutually perpendicular (specifically an x-axis, a y-axis and a z-axis). Furthermore, the object holder may be rotated about two rotation axes which are arranged to be mutually perpendicular. It is therefore possible to move the object to a desired position. It is additionally or alternatively provided in a further embodiment that the aperture unit may be movable along at least one axis. For example, the aperture unit may be movable along three axes which are arranged to be mutually perpendicular. It is additionally or alternatively provided in a further embodiment of the invention that the aperture unit opening may have an adjustable size. It is also additionally or alternatively provided in a further embodiment of the invention that the aperture unit may have several aperture unit openings, each being of a different size. When moving the aperture unit, a specific aperture unit opening having a specific size may be chosen for shaping the particle beam of the particle beam device.

In an embodiment of the particle beam device according to the invention it is additionally or alternatively provided that the particle beam device may have at least one guiding unit for guiding the particle beam onto the object.

In a further embodiment of the particle beam device according to the invention it is additionally or alternatively provided that the particle beam generator is a first particle beam generator for generating a first particle beam comprising first charged particles. The objective lens is a first objective lens for focusing the first particle beam onto the object. The particle beam device further comprises a second particle beam generator for generating a second particle beam comprising second charged particles and a second objective lens for focusing the second particle beam onto the object.

In an embodiment of the particle beam device according to the invention it is additionally or alternatively provided that the particle beam device is at least one of the following: an electron beam device or an ion beam device. In particular, the particle beam device may be both an electron beam device and an ion beam device.

BRIEF DESCRIPTION OF THE DRAWINGS

Embodiments of the invention described herein will be explained in more detail in the following text with reference to the figures, in which.

DETAILED DESCRIPTION OF VARIOUS EMBODIMENTS

Figure 1:
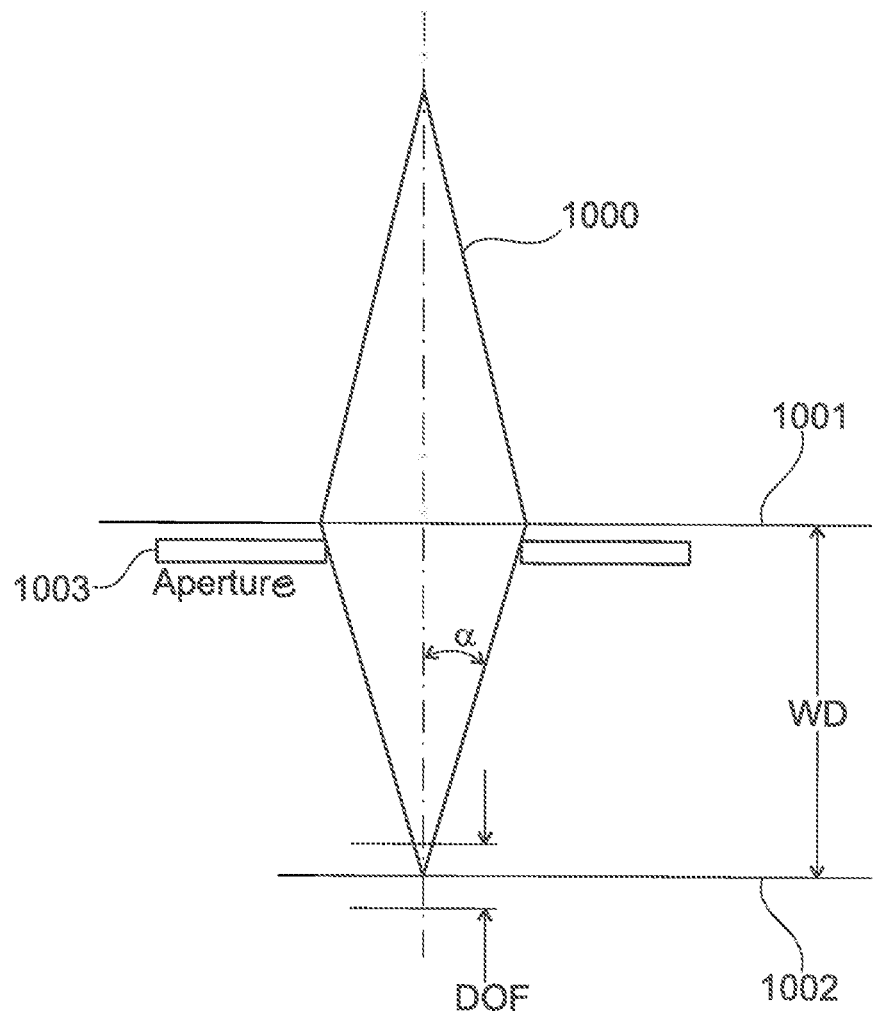
FIG. 1 shows a drawing for explanation of the depth of field (prior art)
Figure 2:
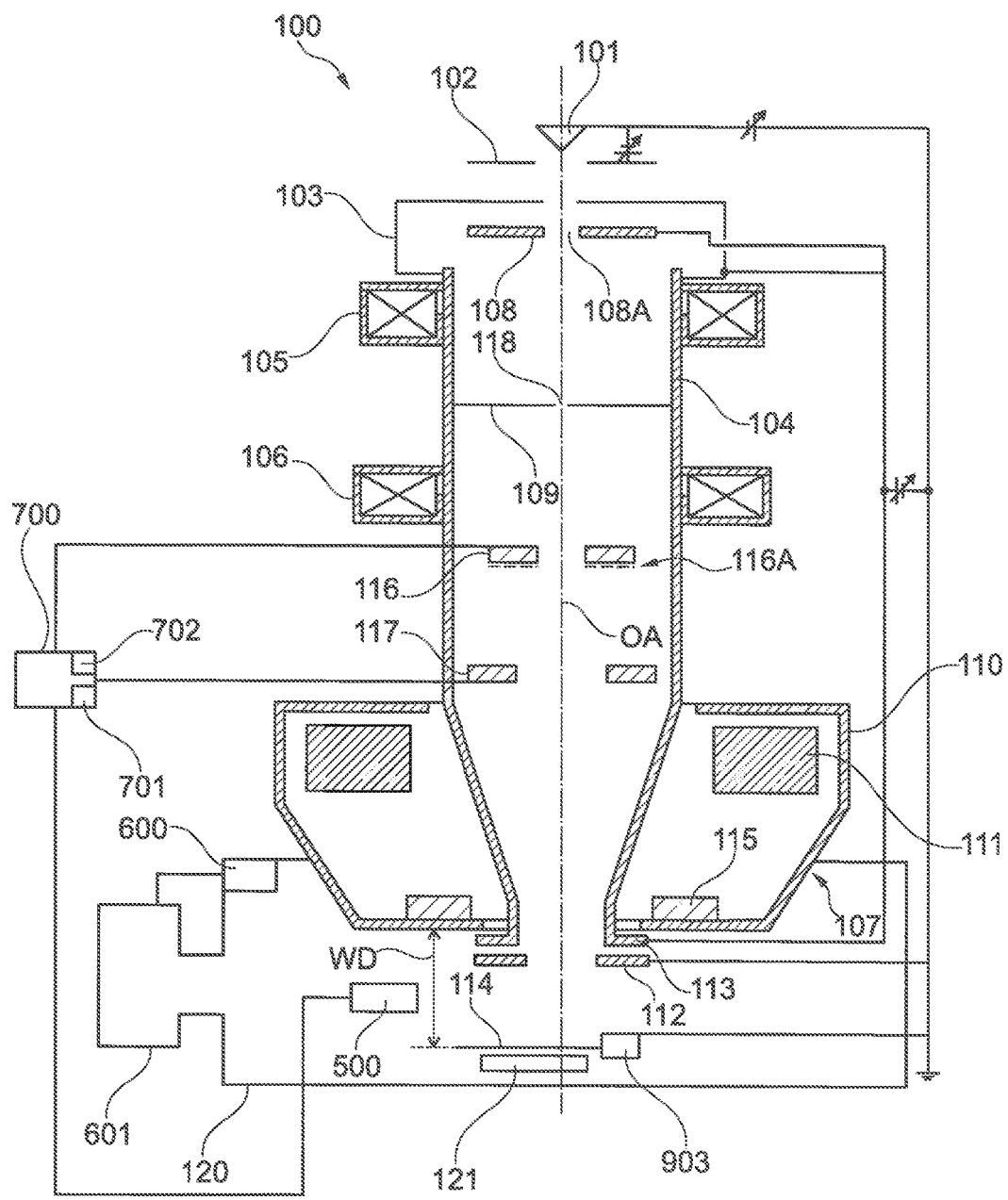
FIG. 2 shows a schematic representation of a first embodiment of a particle beam device.

FIG. 2 shows a schematic representation of an SEM 100. The SEM 100 has a beam generator in the form of an electron source 101 being a cathode, an extraction electrode 102, and an anode 103 which is arranged on the end of a beam guide tube 104 of the SEM 100. The electron source 101 is, for example, a thermal field emitter. However, the invention is not limited to such an electron source. Instead, any electron source may be used. Electrons emerging from the electron source 101 form a primary electron beam. The electrons are accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the invention is not limited to the use of two condenser lenses. Further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground potential. The first aperture unit 108 may have several first aperture openings 108A. One of those first aperture openings 108A is shown in FIG. 2. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. For example, the first aperture unit 108 may be movable along three axes which are arranged to be mutually perpendicular. When moving the first aperture unit 108, a specific first aperture opening 108A having a specific size may be chosen for forming and/or limiting the particle beam of the SEM 100. It is additionally or alternatively provided in a further embodiment of the invention that the first aperture openings 108A may have an adjustable size. However, the invention is not limited to this embodiment. In an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable. For example, the second aperture unit 109 may be movable along three axes which are arranged to be mutually perpendicular. When moving the second aperture unit 109, the position of the second aperture unit 109 may be adjusted for forming and/or limiting the primary electron beam of the SEM 100.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. It has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, this is the ground potential of the object chamber 120. Thus, the electrons of the primary electron beam may be decelerated to the desired energy required for analyzing the object 114.

The object 114 is arranged at a movable object holder 903. The object holder 903 may be movable along three axes which are arranged to be mutually perpendicular (specifically an x-axis, a y-axis and a z-axis). Furthermore, the object holder 903 may be rotated about two rotation axes which are arranged to be mutually perpendicular. It is therefore possible to move the object to a desired position. A working distance WD, which is the distance between the objective lens 107 and the object plane of the object 114 may be adjusted by moving the object holder 903.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and they are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered on the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered at the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons are detected mainly by the first detector 116.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively the second detector 117 may have a further opposing field grid being designed similar to the above mentioned opposing field grid 116A of the first detector 116 and having an analog function. The detection signals generated by the first detector 116 and the second detector 117 are used to generate an image or images of the surface of the object 114.

It is pointed out expressly that the aperture openings of the first aperture unit 108 and the second aperture unit 109 as well as the through openings of the first detector 116 and the second detector 117 are represented in an exaggerated manner. The through openings of first detector 116 and the second detector 117 have a maximum length of between 1 mm and 5 mm perpendicular to the optical axis OA. For example, they have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 μm to 50 μm, for example, 35 μm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has a radiation detector 500 which is arranged in the object chamber 120. The radiation detector 500 is, for example, positioned between the beam guide tube 104 and the object 114. Moreover, the radiation detector 500 is positioned at the side of the object 114. The radiation detector 500 may be a CCD-detector.

The object chamber 120 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 120 for measuring the pressure in the object chamber 120. A pump system 601 being connected to the pressure sensor 600 and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 will be detected using the third detector 121.

The first detector 116, the second detector 117 and the radiation detector 500 are connected to an analysis unit 700. The analysis unit 700 comprises a display unit 701. The analysis unit 700 also comprises a storage unit 702.

Figure 3:
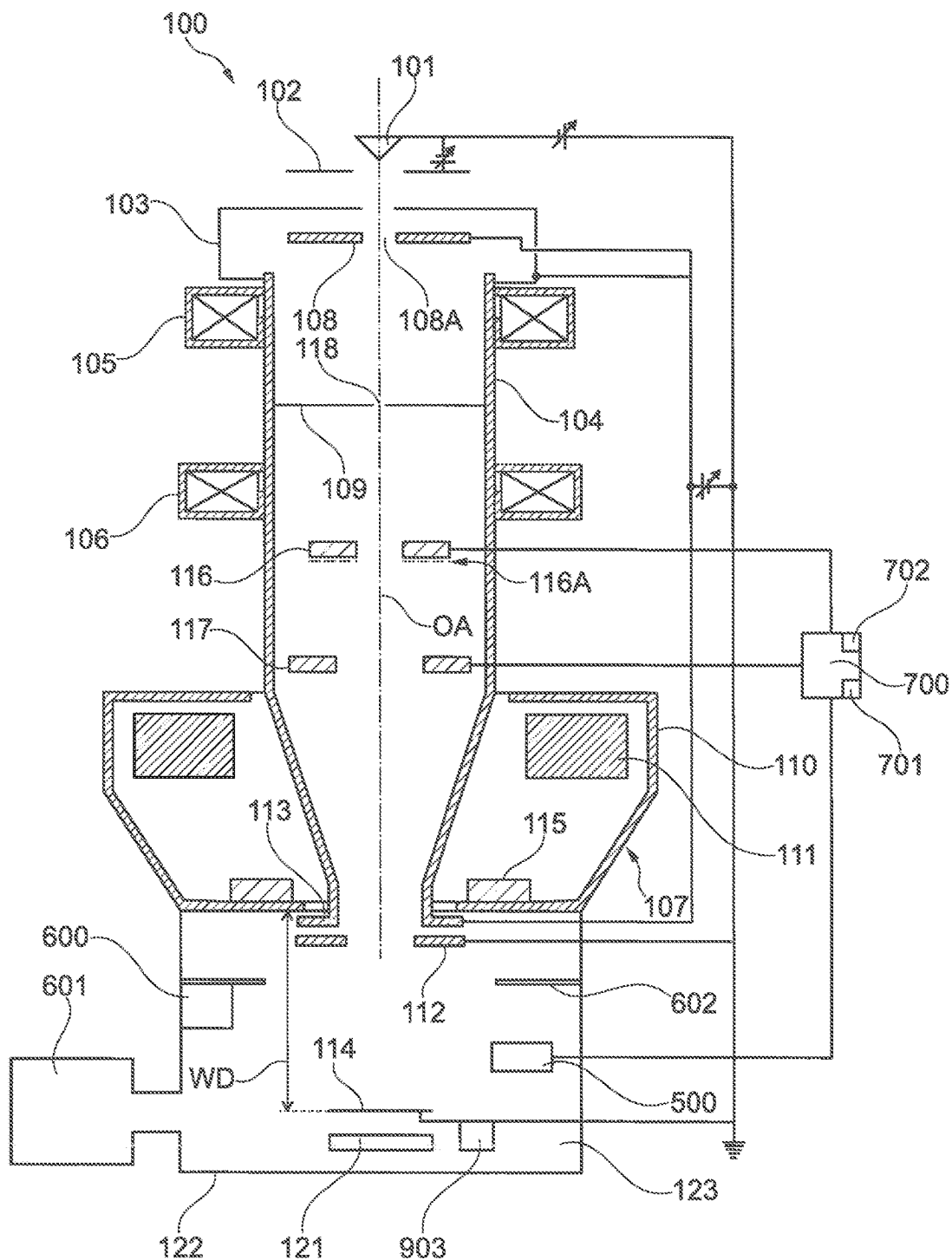
FIG. 3 shows a schematic representation of a second embodiment of a particle beam device.

FIG. 3 shows a schematic representation of a further SEM 100. The embodiment of FIG. 3 is based on the embodiment of FIG. 2. Identical reference signs denote identical components. In contrast to the SEM 100 of FIG. 2, the SEM 100 of FIG. 3 comprises an object chamber 122. A pressure limiting aperture 602 is arranged between the beam guide tube 104 and an object area 123 of the object chamber 122. The SEM 100 according to FIG. 3 is suited in particular for the SEM 100 being operated in the second pressure range.

Figure 4:
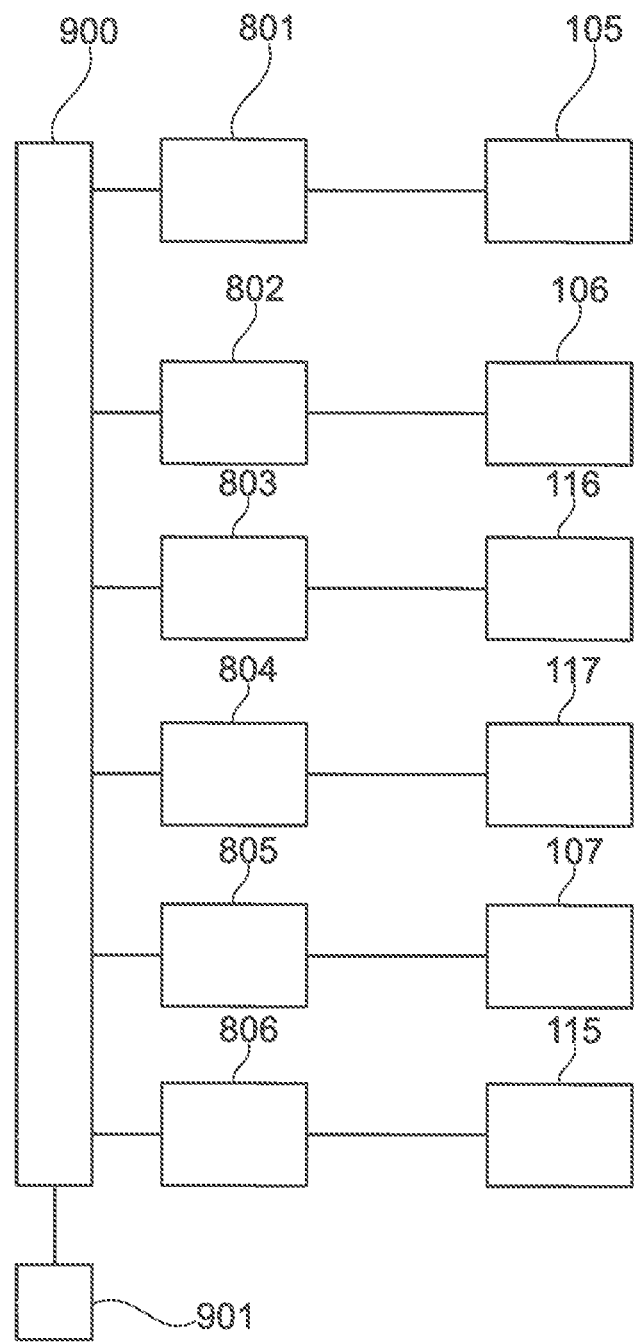
FIG. 4 shows a schematic representation of a microprocessor and control units for the embodiments of the particle beam devices of FIGS. 2 and 3.

FIG. 4 is a schematic representation of a microprocessor 900 comprised by the SEM 100 according to FIGS. 2 and 3. The microprocessor 900 is connected to several control units for controlling the units of the SEM 100. Moreover, the microprocessor 900 is also connected to a control storage unit 901 comprising values of control parameters which may be used for controlling the control units of the SEM 100. For example, the SEM 100 may have a first control unit 801 connected to the first condenser lens 105, a second control unit 802 connected to the second condenser lens 106, a third control unit 803 connected to the first detector 116, a fourth control unit 804 connected to the second detector 117, a fifth control unit 805 connected to the objective lens 107 and a sixth control unit 806 connected to the scanning device 115.

A computer program product comprising a program code is loaded into the microprocessor 900, which, when being executed, controls the SEM 100 according to FIGS. 2 and 3 in such a way that a method according to the invention is carried out. This will be explained further below.

Figure 5:
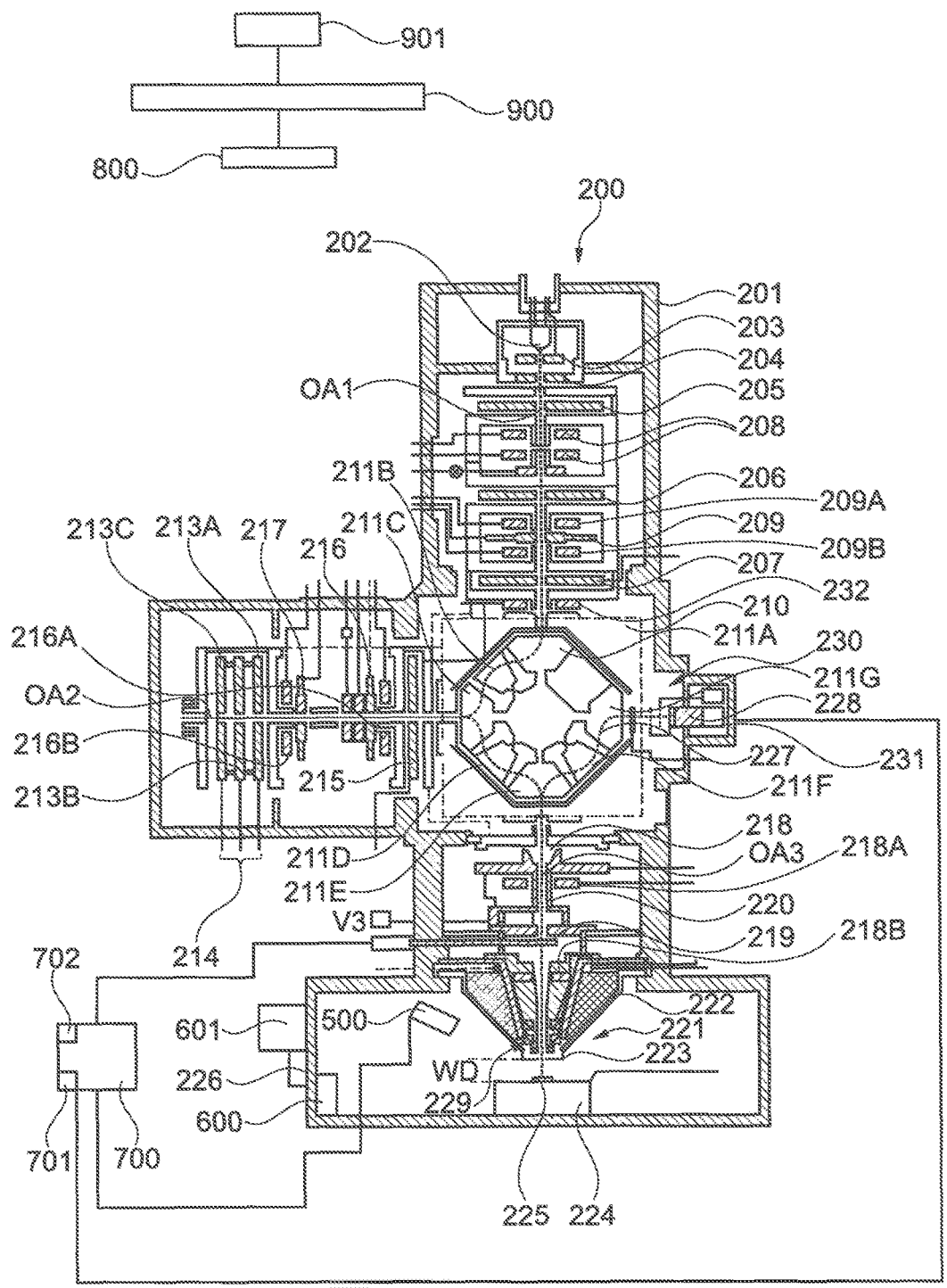
FIG. 5 shows a schematic representation of a third embodiment of a particle beam device.

FIG. 5 is a schematic illustration of a further embodiment of a particle beam device according to the invention. This embodiment of the particle beam device is denoted with reference sign 200 and comprises a mirror corrector for correcting, for example, chromatic and spherical aberrations. The particle beam device 200 comprises a particle beam column 201 being embodied as an electron beam column and, in principle, corresponds to an electron beam column of a corrected SEM. However, the particle beam device 200 according to the invention is not restricted to an SEM with a mirror corrector. Rather, any particle beam device comprising correction units may be used.

The particle beam column 201 comprises a beam generator in the form of an electron source 202 (namely a cathode), an extraction electrode 203 and an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment comprises a gun alignment unit comprising two magnetic deflection units 208 arranged along the first optical axis OA1. Furthermore, the particle beam device 200 comprises electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 comprises several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is provided by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is provided by the third magnetic sector 211C, the fourth magnetic sector 211D and the fifth magnetic sector 211E. In the embodiment shown in FIG. 5, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200 according to the invention is not restricted to deflection angles of 90°. Instead, any suitable deflection angle may be used with the beam deflection device 210, for example 70° or 110° such that the first optical axis OA1 does not run coaxially to the third optical axis OA3. For further details of the beam deflection device 210 reference is made to WO 2002/067286 A2, which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 comprises a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220. The fifth multipole unit 218A and the sixth multipole unit 218B may each be a condenser lens.

The primary particle beam is focused by the objective lens 221 in a focal plane in which the object 225 is positioned. The object 225 is arranged on an object holder 224 in the form of a movable sample stage. The movable object holder 224 is arranged in an object chamber 226 of the particle beam device 200. The object holder 224 may be movable along three axes which are arranged to be mutually perpendicular (specifically an x-axis, a y-axis and a z-axis). Furthermore, the object holder 224 may be rotated about two rotation axes which are arranged to be mutually perpendicular. It is therefore possible to move the object 225 to a desired position. A working distance WD, which is the distance between the objective lens 221 and the object plane of the object 225, may be adjusted by moving the object holder 224.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the object holder 224. The objective lens 221 is not restricted to a combination of the magnetic lens 222 and the sixth electrostatic lens 223. Rather, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction to that of the primary particle beam.

The particle beam device 200 comprises a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance to the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of a detection unit 231. The total deflection angle may be, for example, 90° or 110°.

The first detector 219 generates detection signals mostly based on the emitted secondary electrons. The second detector 228 of the detection unit 231 generates detection signals mostly based on backscattered electrons. The detection signals generated by the first detector 219 and the second detector 228 are transmitted to an analysis unit 700 and are used to obtain information about the properties of the interaction area of the focused primary particle beam with the object 225. If the focused primary particle beam is scanned over the object 225 using a scanning device 229, and if the analysis unit 700 acquires and stores the detection signals generated by the first detector 219 and the second detector 228, an image of the scanned area of the object 225 can be acquired and displayed by the analysis unit 700 or a display unit 701.

A filter electrode 230 may be arranged in front of the second detector 228 of the detection unit 231. The filter electrode 230 may be used to separate the secondary electrons from the backscattered electrons due to the kinetic energy difference between the secondary electrons and the backscattered electrons.

In addition to the first detector 219 and the second detector 228, the particle beam device 200 also has a radiation detector 500 which is arranged in the object chamber 226. The radiation detector 500 is positioned at the side of the object 225 and is directed to the object 225. The radiation detector 500 may be a CCD-detector and detects interaction radiation arising from the interaction of the primary particle beam with the object 225, in particular X-rays and/or cathodoluminescence light.

The object chamber 226 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 226 for measuring the pressure in the object chamber 226. A pump system 601 being connected to the pressure sensor 600 and being arranged at the object chamber 226 provides for the pressure range in the object chamber 226, either the first pressure range or the second pressure range.

The first detector 219, the second detector 228 of the detection unit 231 and the radiation detector 500 are connected to the analysis unit 700. The analysis unit 700 comprises the display unit 701. The analysis unit 700 also comprises a storage unit 702.

FIG. 5 also shows a schematic representation of a microprocessor 900 comprised by the particle beam device 200. The microprocessor 900 is connected to a control unit 800 for controlling at least one of the guiding units of the particle beam 200. Moreover, the microprocessor 900 is also connected to a control storage unit 901 comprising values of control parameters which may be used for controlling the control unit. The control unit 800 is connected to the guiding units (not shown for reasons of clarity). The guiding units may be, for example, the first electrostatic lens 205, the second electrostatic lens 206, the third electrostatic lens 207, the magnetic deflection unit 208, the first electrostatic beam deflection unit 209, the first multipole unit 209A, the second multipole unit 209B, the beam deflection device 210, the first magnetic sector 211A, the second magnetic sector 211B, the third magnetic sector 211C, the fourth magnetic sector 211D, the fifth magnetic sector 211E, the sixth magnetic sector 211F, the seventh magnetic sector 211G, the fourth electrostatic lens 215, the second electrostatic beam deflection unit 216, the third multipole unit 216A, the fourth multipole unit 216B, the third electrostatic beam deflection unit 217, the fifth electrostatic lens 218, the fifth multipole unit 218A, the sixth multipole unit 218B, the first detector 219, the objective lens 221, the magnetic lens 222, the sixth electrostatic lens 223, the second detector 228, the scanning device 229, the filter electrode 230 and/or the further magnetic deflection device 232.

A computer program product comprising a program code is loaded into the microprocessor 900, which, when being executed, controls the particle beam device 200 in such a way that a method according to the invention is carried out. This will be explained further below.

Figure 6:
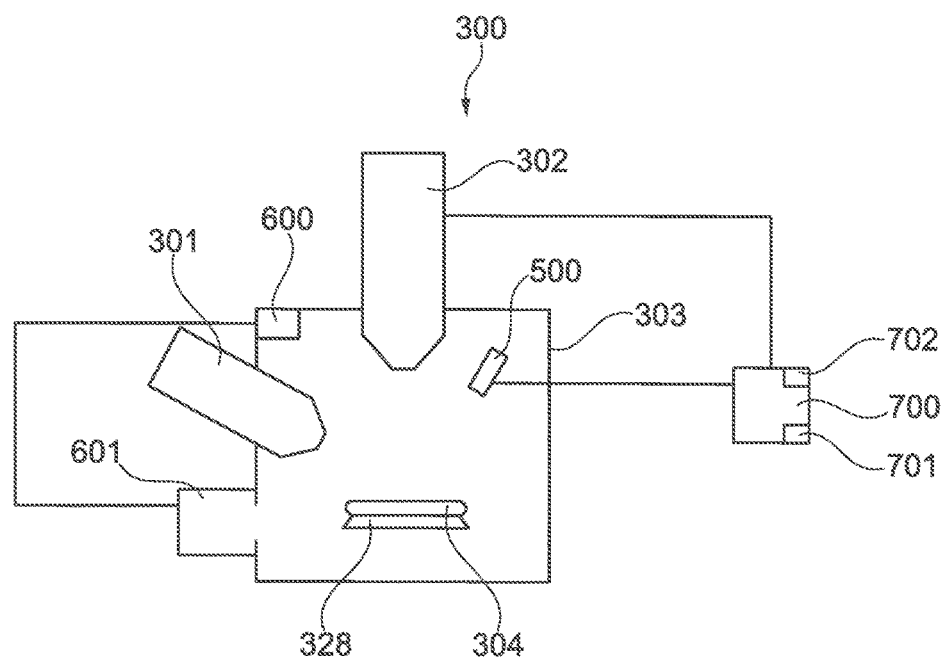
FIG. 6 shows a schematic representation of a fourth embodiment of a particle beam device.

FIG. 6 shows a schematic illustration of another embodiment of a particle beam device 300 according to the invention. The particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 7:
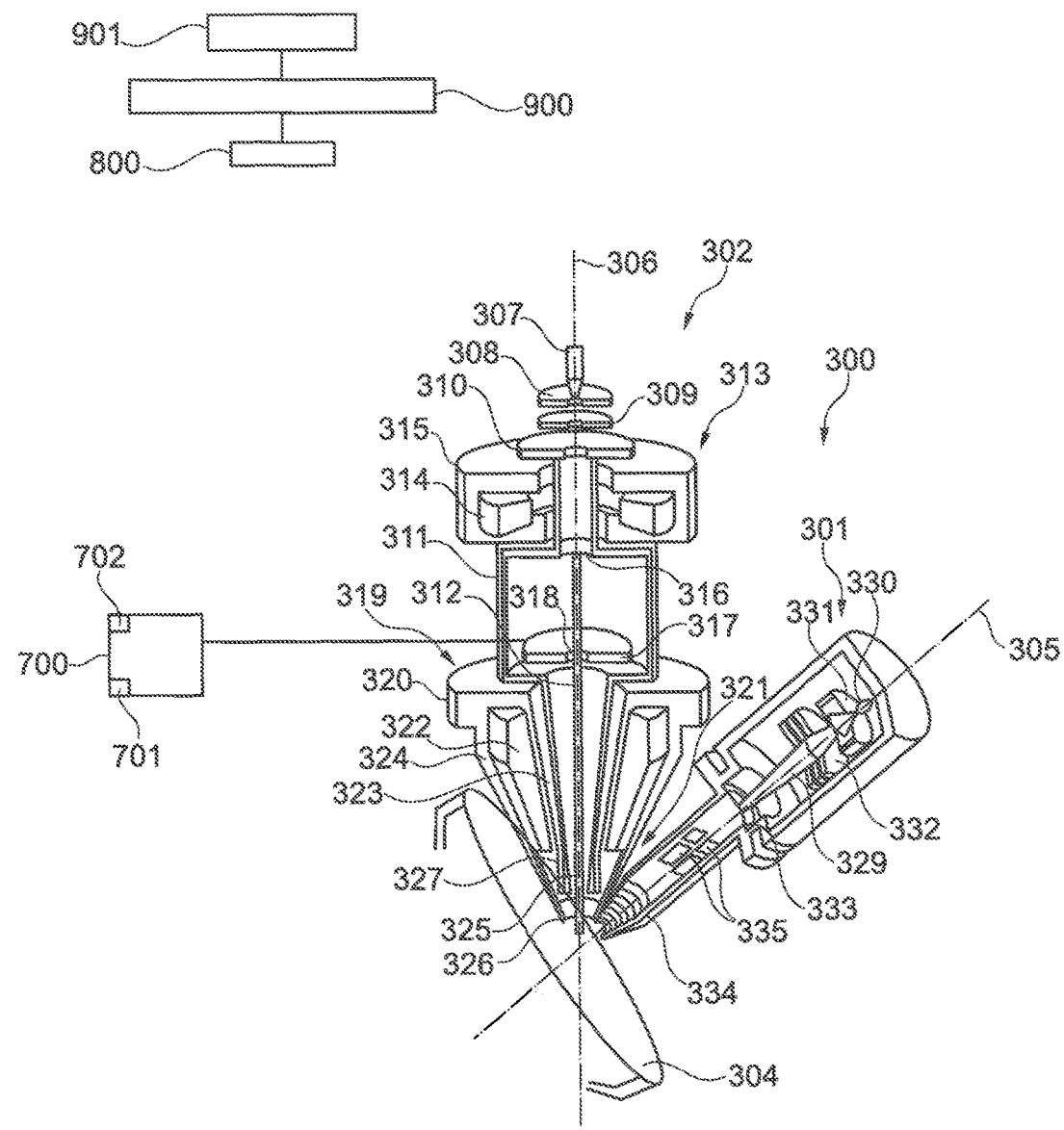
FIG. 7 shows a further schematic representation of the particle beam device according to FIG. 6.

FIG. 7 shows a detailed illustration of the particle beam device 300 shown in FIG. 6. For clarity reasons, the object chamber 303 is not illustrated. The first particle beam column 301, in the form of the ion beam column, has a first optical axis 305. Furthermore, the second particle beam column 302, in the form of the electron beam column, has a second optical axis 306.

The second particle beam column 302, in the form of the electron beam column, will be described next. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second particle beam 312, in the form of an electron beam, is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second particle beam 312 in the form of the electron beam passes through the beam guide tube 311, and is focused onto the object 304 to be analyzed and/or processed. This will be described in more detail further below.

The beam guide tube 311 passes through a collimator arrangement 313 which has a first annular coil 314 and a yoke 315. The collimator arrangement 313 may be a condenser lens. Seen in the direction of the object 304, from the second beam generator 307, the collimator arrangement 313 is followed by a aperture unit 316 and a detector 317 with a central opening 318 arranged along the second optical axis 306 in the beam guide tube 311.

The aperture unit 316 may be movable along three axes which are arranged to be mutually perpendicular. It is additionally or alternatively provided in a further embodiment of the invention that the aperture unit 316 may have an opening with an adjustable size.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to an analysis unit 700.

Interaction radiation, for example X-rays or cathodoluminescence light, may be detected by using a radiation detector 500, for example a CCD-detector, which is arranged in the object chamber 303 (see FIG. 6). The radiation detector 500 is positioned at the side of the object 304 and is directed to the object 304.

The object 304 is arranged on an object holder 328 in the form of a sample stage as shown in FIG. 6, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329. Alternatively, the surface of the object 304 may be oriented in such a way that the surface of the object 304 on one hand and the first particle beam 329 or the second particle beam 312 on the other hand are at an angle, for example in the range of 0° to 90°.

As mentioned previously, reference symbol 301 denotes the first particle beam column, in the form of the ion beam column. The first particle beam column 301 has a first beam generator 330 in the form of an ion source. The first beam generator 330 is used for generating the first particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The variable aperture 333 may be movable along three axes which are arranged to be mutually perpendicular. It is additionally or alternatively provided in a further embodiment of the invention that the variable aperture 333 may have an opening with an adjustable size. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 303 for measuring the pressure in the object chamber 303 (see FIG. 6). A pump system 601 being connected to the pressure sensor 600 and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron beam induced deposition.

The detector 317 and the radiation detector 500 are connected to the analysis unit 700 as shown in FIGS. 6 and 7. The analysis unit 700 comprises a display unit 701. The analysis unit 700 also comprises a storage unit 702.

FIG. 7 also shows a schematic representation of a microprocessor 900 comprised by the particle beam device 300. The microprocessor 900 is connected to a control unit 800 for controlling at least one of the guiding units of the particle beam device 300. Moreover, the microprocessor 900 is also connected to a control storage unit 901 comprising values of control parameters which may be used for controlling the control unit 800. The control unit 800 is connected to the guiding units (not shown for reasons of clarity). The guiding units may be, for example, the first electrode 308, the second electrode 309, the third electrode 310, the collimator arrangement 313, the first annular coil 314, the yoke 315, the aperture unit 316, the detector 317, the central opening 318, the second objective lens 319, the magnetic lens 320, the electrostatic lens 321, the second annular coil 322, the inner pole piece 323, the outer pole piece 324, the terminating electrode 326, the raster device 327, the extraction electrode 331, the collimator 332, the variable aperture 333, the first objective lens 334 and/or the raster electrodes 335.

A computer program product comprising a program code is loaded into the microprocessor 900, which, when being executed, controls the particle beam device 300 in such a way that a method according to the invention is carried out. This will be explained further below.

FIGS. 8 to 15 show embodiments of the method according to the invention. The embodiments of the method according to the invention shown in FIGS. 8 to 15 are carried out using the SEM 100 according to FIG. 2. It is noted that the method according to the invention may also be carried out with other particle beam devices, in particular the SEM 100 of FIG. 3, the particle beam device 200 of FIG. 5 and the particle beam device 300 of FIGS. 6 and 7.

Figure 8:
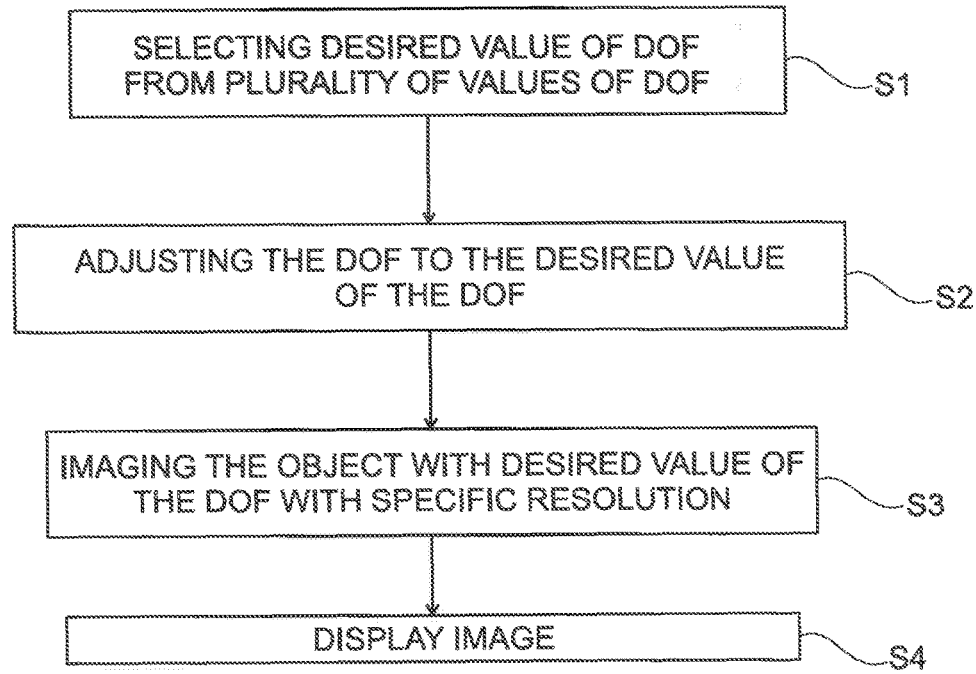
FIG. 8 shows a flow chart of an embodiment of a method according to the invention.

FIG. 8 shows a first embodiment of the method according to the invention used with the SEM 100. In method step S1, a desired value of the depth of field (hereinafter referred to as DOF) from a plurality of values of the DOF is selected by a user. Therefore, the user selects the desired value of the DOF according to the user's needs. Each value of the plurality of the values of the DOF is associated with a specific resolution of the SEM 100, the specific resolution being achieved when using the desired value of the DOF for imaging the object 114. This has been explained further above.

In method step S2, the DOF is adjusted to the desired value of the DOF. For example, the DOF is adjusted to the desired value of the DOF by controlling the first condenser lens 105 and/or the second condenser lens 106. The first control unit 801 is used for controlling the first condenser lens 105. The second control unit 802 is used for controlling the second condenser lens 106. The first control unit 801 and/or the second control unit 802 may load values of control parameters from the control storage unit 901 via the microprocessor 900. In particular the excitation of the first condenser lens 105 and/or of the second condenser lens 106 is adjusted. Additionally or alternatively the relative position of the object 114 to the objective lens 107 is controlled by moving the object holder 903. Therefore, the DOF is adjusted to the desired value of the DOF by adjusting the working distance WD. Additionally or alternatively the DOF is adjusted to the desired value of the DOF by adjusting the position of the first aperture unit 108. When moving the first aperture unit 108, a specific first aperture opening 108A having a specific size may be chosen for shaping (forming) and/or limiting the particle beam of the SEM 100. Additionally or alternatively the primary particle beam is guided to and through a specific first aperture opening 108A having a specific size, wherein the specific first aperture opening 108A may be chosen by the user.

In method step S3, the object 114 is imaged with the desired value of the DOF and with the specific resolution associated with the desired value of the DOF. In a further method step S4, the image of the object 114 is shown on the display unit 701 of the analysis unit 700.

The method according to the invention is based on the idea that the user selects the desired value of the DOF to be obtained when imaging the object 114. The user selects the desired value of the DOF regardless of the quality of the resolution. Accordingly, the user does not select the desired value of the DOF in such a manner as to realize the best resolution. Instead, the image of the object 114 is generated with the desired value of the DOF and the specific resolution which is associated with the desired value of the DOF and is inherently given by the operation mode of the SEM 100.

Figure 9:
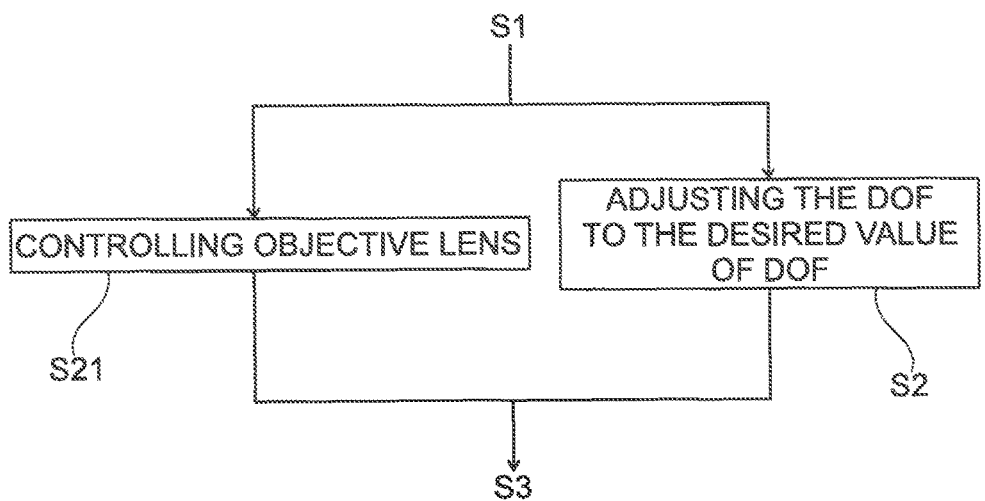
FIG. 9 shows an embodiment of the method according to FIG. 8 comprising an additional step.

In an embodiment of the method according to FIG. 8, an additional step is carried out when method step S2 is carried out, namely method step S21. Therefore, method step S21 is carried out in parallel and dependent on method step S2. The method step S21 is shown in FIG. 9. In method step S21, the objective lens 107 is adjusted in such a way that the image of the object 114 remains in focus when adjusting the DOF to the desired value of the DOF. However, since the DOF might change again when adjusting the objective lens 107, the objective lens 107 is adjusted in parallel and dependent on the adjustment of the DOF such that (i) the selected desired value of the DOF is achieved and (ii) the image of the object 114 remains in focus. In particular, the current of the coil 111 of the objective lens 107 is controlled in such a way that the image of the object 114 remains in focus when adjusting the DOF to the desired value of the DOF. The objective lens 107 is controlled by the fifth control unit 805. The fifth control unit 805 may load values of control parameters from the control storage unit 901 via the microprocessor 900. The objective lens 107 is controlled using the values of the control parameters such that the image of the object 114 remains in focus. After carrying out method step S2 and S21, method step S3 is carried out. This exemplary embodiment of the invention is in particular used when the DOF is adjusted by controlling the first condenser lens 105 and/or the second condenser lens 106 and/or the relative position of the object 114 to the objective lens 107.

The embodiment shown in FIGS. 8 and 9 as well as further embodiments of the method according to the invention discussed further above or below provide for the SEM 100 to be controlled in such a way that specific image properties are given. These embodiments of the method according to the invention are based on the idea that adjusting the DOF to the desired value of the DOF as mentioned above may change the image properties, since in particular a change of characteristics of the first condenser lens 105 and/or the second condenser lens 106 and/or the position and size of opening the first aperture unit 108A has an effect on the form and path of the primary electron beam, which ultimately affects image properties such as, for example, the focus of the primary electron beam onto the object 114 and/or the magnification of the SEM 100. Therefore, these embodiments of the method according to the invention provide for achieving specific image properties selected by the user before imaging the object 114 and before adjusting the DOF to the desired value of the DOF.

Figure 10:
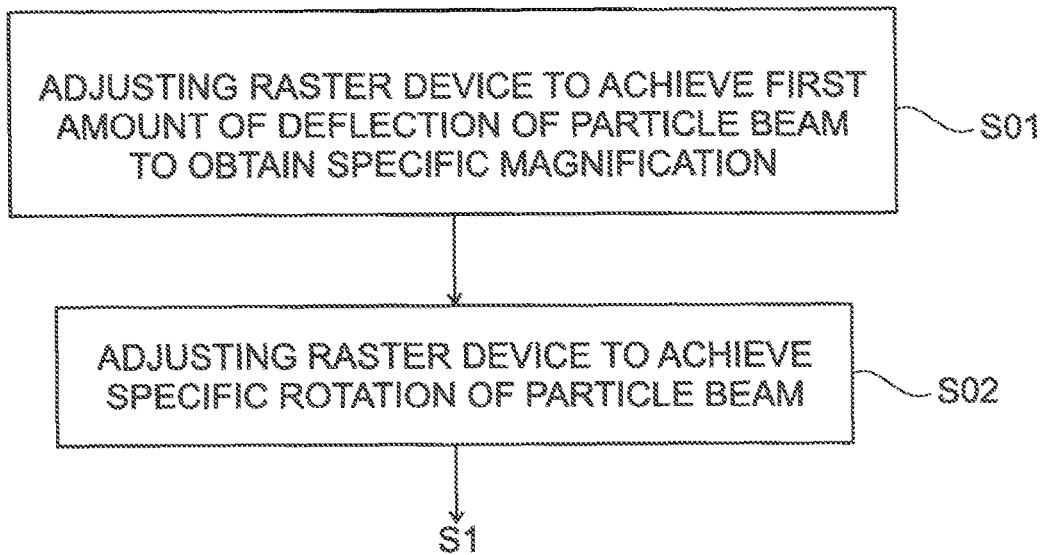
FIG. 10 shows an embodiment of the method according to FIG. 8 comprising additional steps.
Figure 11:
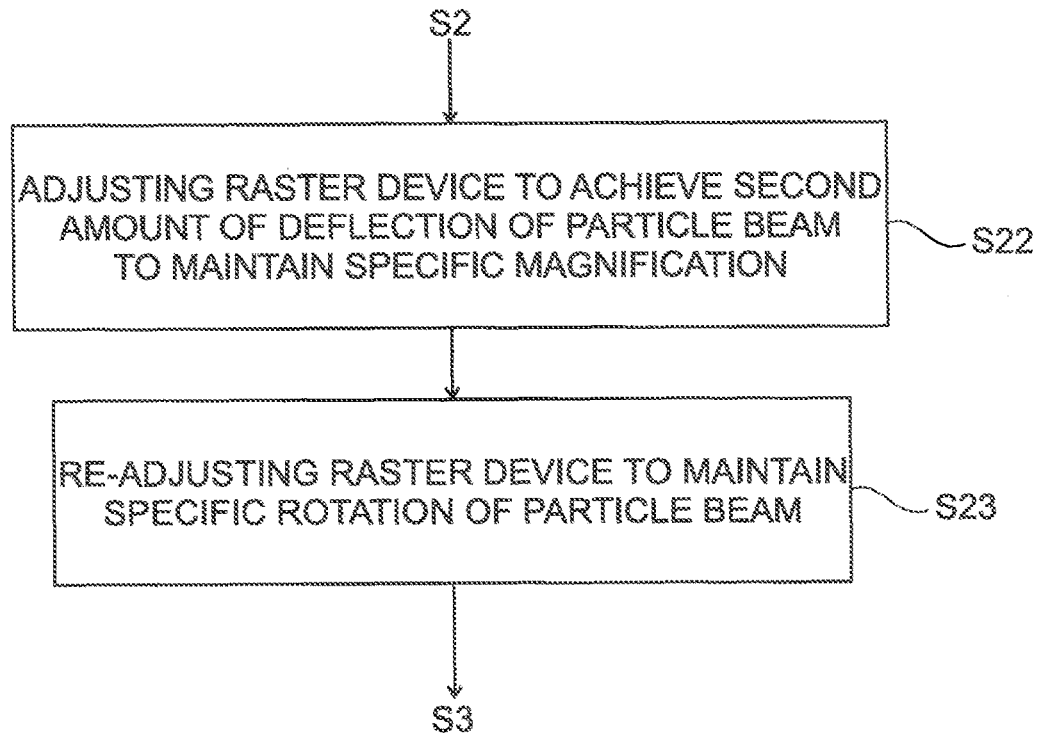
FIG. 11 shows an embodiment of the method according to FIG. 8 comprising additional steps.

A further embodiment of the method according to FIG. 8 is shown in FIGS. 10 and 11. FIGS. 10 and 11 show additional steps of the method according to FIG. 8. In particular, the embodiment according to FIGS. 10 and 11 is provided for carrying out method steps S01 and/or S02 before method step S1 of the method according to FIG. 8 is carried out. In method step S01, the raster device 115 is adjusted to achieve a first amount of deflecting the particle beam in the form of the primary particle beam (that is to say a first degree of deflection of the primary particle beam) to obtain a specific magnification of the SEM 100. Therefore, the user selects the specific magnification of the SEM 100 for imaging the object 114. As mentioned above, the raster device 115 of the SEM 100 is controlled by the sixth control unit 806. The sixth control unit 806 may load values of control parameters from the control storage unit 901 via the microprocessor 900. The raster device 115 is controlled using the values of the control parameters. Additionally or alternatively, in method step 302, the raster device 115 is adjusted in such a way that a specific rotation of the particle beam in the form of the primary electron beam with respect to the optical axis OA of the SEM 100 is achieved. As mentioned above, the SEM 100 may have an electronic scan rotation feature that permits to orient the image of the display unit 701 to any position through rotation of up to 360°. A scan rotation may be achieved using the raster device 115 which rotates the scanned field of the object 114 in its own plane around the optical axis OA of the SEM 100. After method step S01 and/or method step S02 has/have been carried out, method step S1 of the method according to FIG. 8 is carried out.

The embodiment of the method according to FIGS. 10 and 11 also comprises at least one additional step after method step S2, in particular method step S22 and/or method S23 as shown in FIG. 11. In method step S22, the raster device 115 is adjusted to achieve a second amount of deflecting the particle beam in the form of the primary electron beam (that is to say a second degree of deflection of the primary particle beam) to maintain the specific magnification of the SEM 100 achieved in method step S01 and after having adjusted the DOF to the desired value of the DOF as mentioned above.

In method step S23, the raster device 115 is re-adjusted to maintain the specific rotation of the particle beam in the form of the primary electron beam with respect to the optical axis OA. Therefore, the raster device 115 is re-adjusted in such a way that the specific scan rotation achieved in method step S02 is maintained. As mentioned above, the raster device 115 of SEM 100 is controlled by the sixth control unit 806. The sixth control unit 806 may load values of control parameters from the control storage unit 901 via the microprocessor 900. The raster device 115 is controlled using the values of the control parameters for carrying out method step S22 and/or method step S23. A control parameter may be, for example, a physical quantity, in particular a control current or a control voltage. Additionally or alternatively, the control parameter may also be, for example, the proportion of physical quantities.

Figure 12:
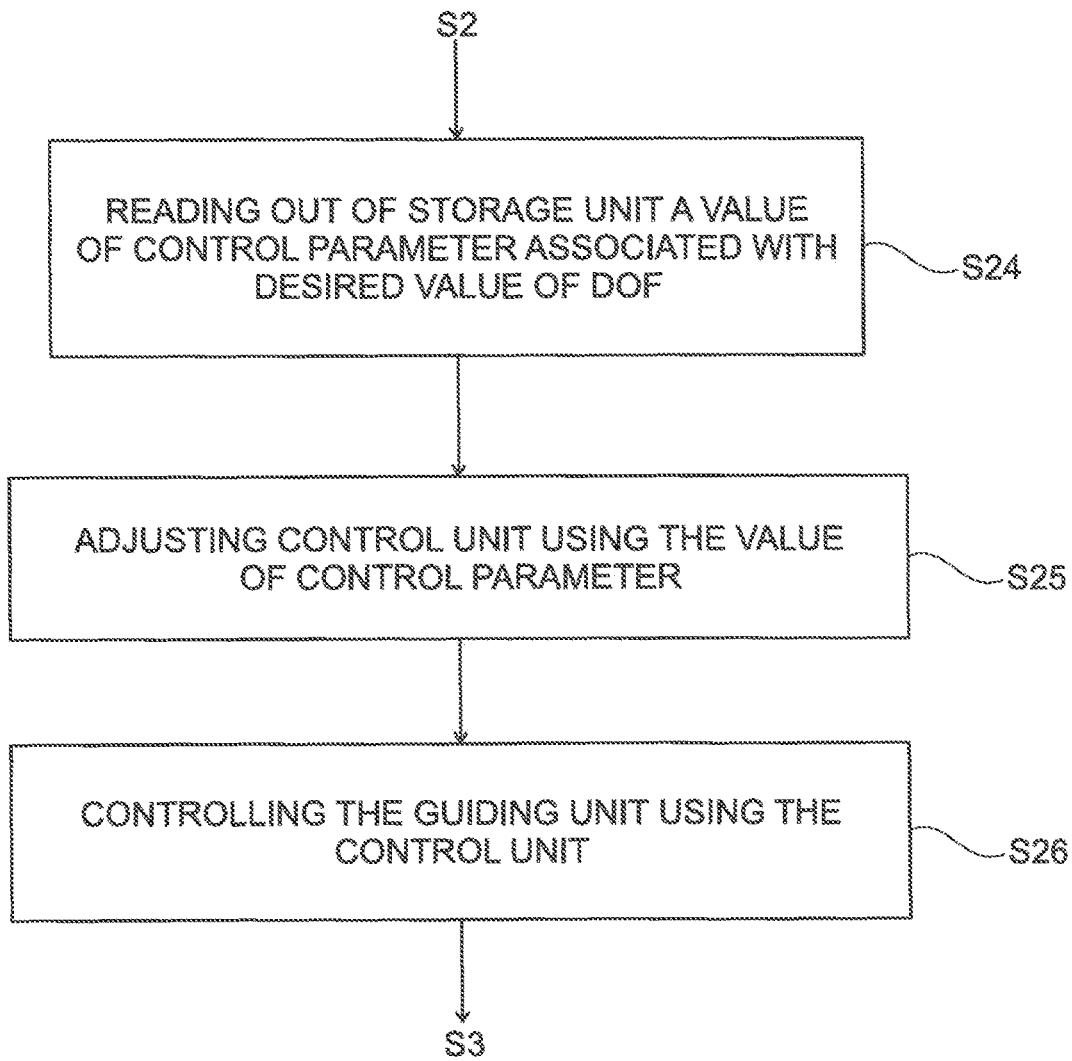
FIG. 12 shows an embodiment of the method according to FIG. 8 comprising additional steps.

A further embodiment of the method according to FIG. 8 is shown in FIG. 12. FIG. 12 shows additional steps of the method according to FIG. 8. In particular, the embodiment according to FIG. 12 additionally comprises method steps S24 to S26 being carried out after method step S2 of the method according to FIG. 8. The embodiment of FIG. 12 is based on the idea that specific image properties such as, for example, focus and/or magnification may be achieved for each desired value of the DOF. Therefore, the control storage unit 901 comprises values of control parameter(s) associated with each value of the plurality of values of the DOF. Those associated values of the control parameter(s) are used for controlling the control units mentioned above and below and for achieving the required and specific image properties. Accordingly, in method step S24, the values of control parameters associated with the desired value of the DOF are read out of the control storage unit 901 into the microprocessor 900. In method step S25, the control unit(s) controlling at least one guiding unit or several guiding units of the SEM 100 is/are adjusted using the loaded values of the control parameter(s). The guiding units of the SEM 100 may be, for example, the first condenser lens 105 controlled by the first control unit 801 (if not being used for adjusting the desired value of the DOF), the second condenser lens 106 controlled by the second control unit 802 (if not being used for adjusting the desired value of the DOF), the first detector 116 controlled by the third control unit 803, the second detector 117 controlled by the fourth control unit 804, the objective lens 107 controlled by the fifth control unit 805 and the scanning device 115 controlled by the sixth control unit 806. In method step S26, at least one of the aforementioned units of the SEM 100 is controlled using the respective control unit in such a way that a desired physical effect is achieved, for example generation of a specific magnetic field and/or of a specific electrostatic field and/or a specific amplification.

Examples of control parameters which may be used have been mentioned above. A few examples are discussed further below. A first control parameter for adjusting the third control unit 803 controlling the first detector 116 and/or for the fourth control unit 804 controlling the second detector 117 may be used for controlling the contrast in the image generated using the SEM 100. The contrast in the image may be increased if an amplification factor of an amplifier of the first detector 116 and/or of the second detector 117 is increased. The amplifier amplifies the detection signals generated by the first detector 116 and/or the second detector 117. Similarly, the contrast may be decreased if the amplification factor of the amplifier is decreased. A second control parameter for adjusting the third control unit 803 for controlling the first detector 116 and/or the fourth control unit 804 for controlling the second detector 117 may be used for controlling the brightness in the generated image of the object 114. Controlling the brightness may be effected, for example, by controlling an amplification factor of the detection signal of the first detector 116 and/or the second detector 117. The brightness of each pixel in the image is increased or decreased identically. A third control parameter for adjusting the fifth control unit 805 may be used, for example, for controlling the objective lens 107 which focuses the particle beam in the form of the primary electron beam onto the object 114. A fourth control parameter for adjusting the first control unit 801 controlling the first condenser lens 105 and/or for adjusting the second control unit 802 for controlling the second condenser lens 106 may be used for alignment of the particle beam in the form of the primary electron beam in the objective lens 107.

Figure 13:
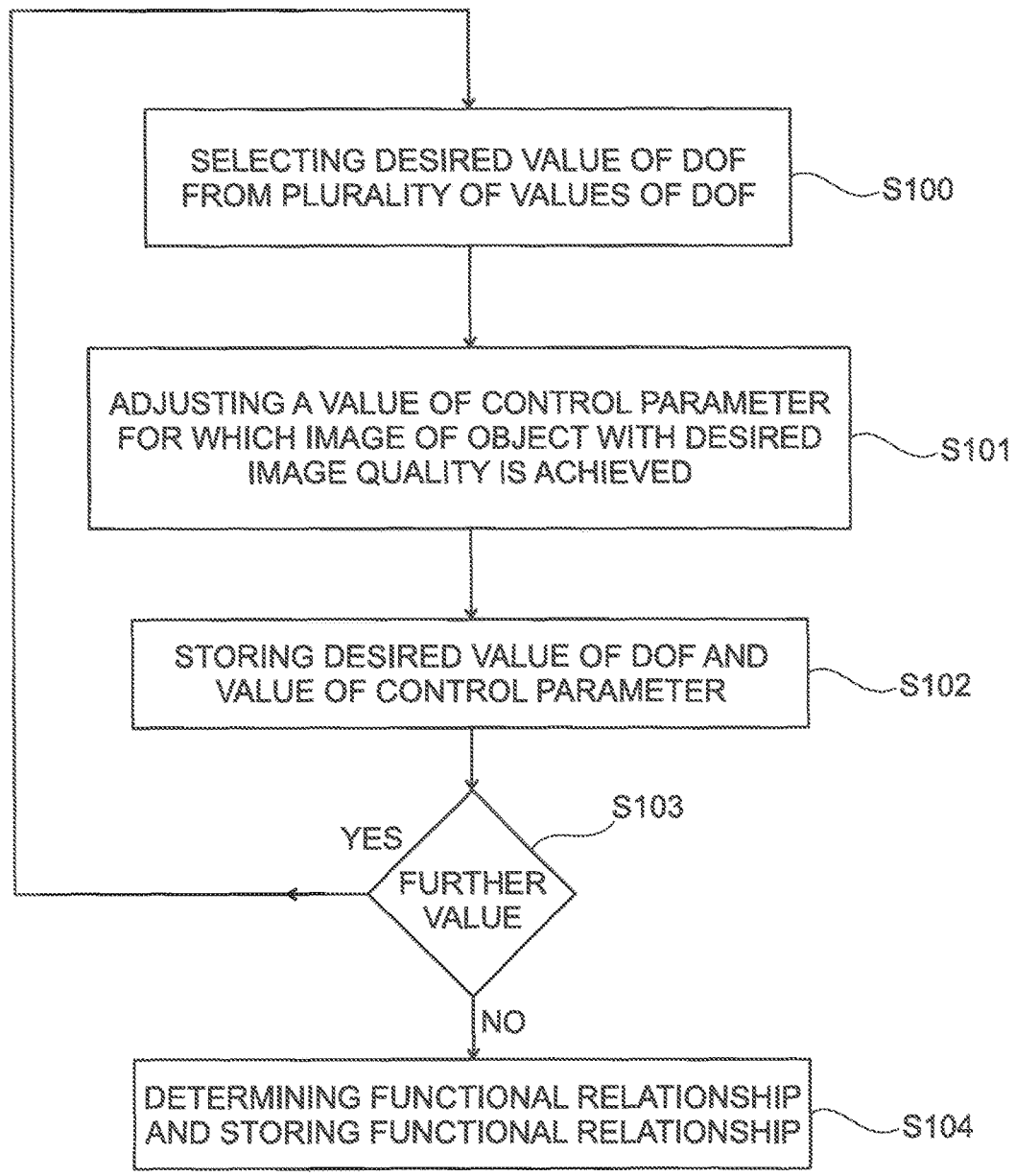
FIG. 13 shows an embodiment of the method including the step of obtaining a functional relationship between a control parameter and the depth of field.

A further embodiment of the method according to the invention is shown in FIG. 13. The embodiment of FIG. 13 provides method steps for obtaining values of a control parameter or several control parameters associated with a desired value of the DOF. The control parameter or the several control parameters may be any one of the control parameters already mentioned above. The embodiment of FIG. 13 is discussed for a single control parameter. However, it is noted that the embodiment of FIG. 13 may be used for determining a functional relationship for each control parameter which may be used in the SEM 100.

In method step S100, a first desired value of the DOF from the plurality of values of the DOF is selected by the user. In method step S101, a first value of the control parameter is adjusted in such a way that a first image of the object 114 with a desired image quality is obtained. In other words, the first value of the control parameters is adjusted in such a way that the image of the object 114 is generated with a good image quality such that the user may be able to sufficiently analyze the object 114 by using information comprised in the obtained image. The image quality may be determined using objective or subjective criteria. For example, using objective criteria, the image quality of an image improves if the resolution in the image of the contrast is increased. The image quality in the image of the object 114 may also be determined using a signal-to-noise ratio. A signal-to-noise ratio in the range of 0 to 5 may be not sufficient. However, a good signal-to-noise ratio (and, therefore, also a good image quality) may be achieved if the signal-to-noise ratio is in the range of 20 to 40. Alternatively, the image quality may be determined using subjective criteria. Using subjective criteria, the user individually assesses whether the obtained image quality is sufficient or not. However, it may very well be that the image quality being assessed as sufficient by a first user is assessed as not being sufficient by a second user.

In method step S102, the first desired value of the DOF and the first value of the control parameter used in method step S101 are stored in the control storage unit 901. In method step S103 it is determined whether a further image is going to be generated. If a further image is to be generated, method steps S100 to S102 are repeated. Accordingly, in method step S100, a second desired value of the DOF from the plurality of values of the DOF is selected by the user. Moreover, a second value of the control parameter is adjusted in such a way that a second image of the object 114 with the desired image quality is obtained. The second desired value of the DOF and the second value of the control parameter used in method step S101 are stored in the control storage unit 901.

Figure 14:
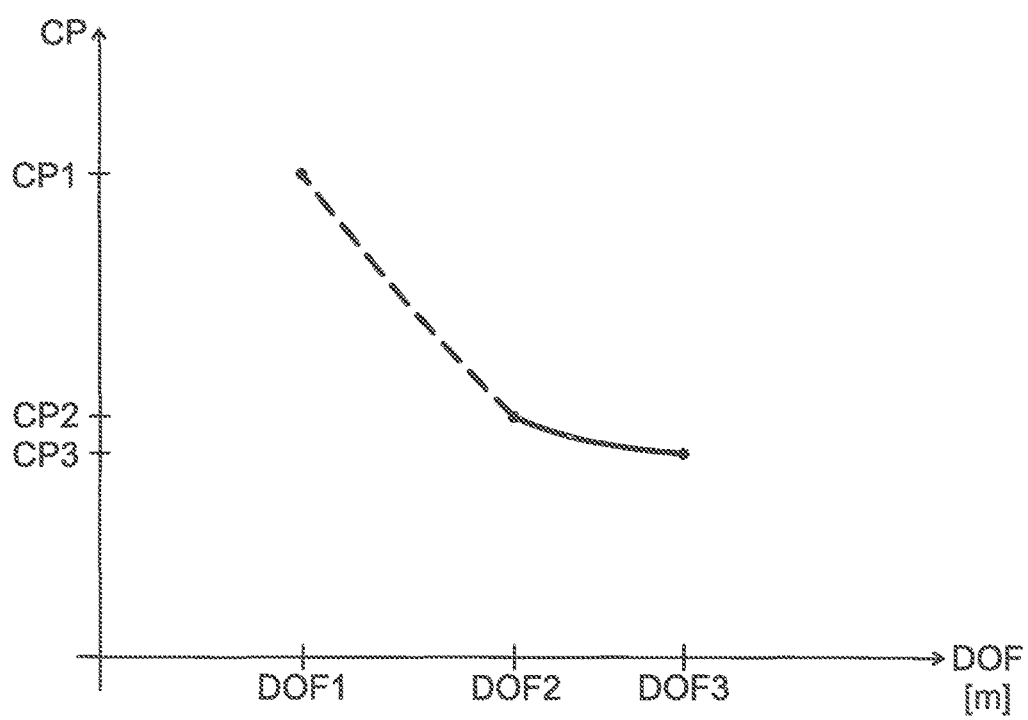
FIG. 14 shows a schematic representation of the dependency of the control parameter and the depth of field.

If no further image is to be generated, the embodiment of the method according to the invention proceeds with method step S104. In method step S104, the functional relationship is determined between the first value of the control parameter and the second value of the control parameter dependent on the desired values of the DOF. FIG. 14 shows the dependency of the control parameter CP. Three images of the object 114 having the desired image quality have been taken using the method steps S100 to S102 of the embodiment shown in FIG. 13. Therefore, method steps S100 to S102 have been carried out three times. A first image having the desired image quality was generated for a first desired value DOF1 of the DOF using a first value CP1 of the control parameter CP. Moreover, a second image having the desired image quality was generated for a second desired value DOF2 of the DOF using a second value CP2 of the control parameter CP. Additionally, a third image having the desired image quality was generated for a third desired value DOF3 of the DOF using a third value CP3 of the control parameter CP.

As mentioned above, a functional relationship between the values CP1, CP2 and CP3 of the control parameter dependent on the values of the DOF is determined. The functional relationship may be a linear relationship or a non-linear relationship. The functional relationship may also comprise a discontinuous function or may be a discontinuous function. The functional relationship may be determined using any kind of suitable determination methods. The determination of the functional relationship may be carried out, for example, using interpolation. Any kind of interpolation may be used, for example linear interpolation, non-linear interpolation, trigonometric interpolation, logarithm interpolation and/or spline interpolation. Additional and/or alternatively it is provided that the determination of the functional relationship is carried out using extrapolation. Any kind of extrapolation method may be used, for example linear extrapolation, non-linear extrapolation, trigonometric extrapolation and/or logarithm extrapolation. Additionally or alternatively, the determination of the functional relationship may be carried out using average determination, determination of random values and/or determination of a minimum value and/or a maximum value of two values. When the functional relationship has been determined, the determined functional relationship may be stored in the control storage unit 901.

The above-mentioned embodiment is based on the idea that by generating only a few images of the object 114 having a desired image quality and by determining values of the control parameter it is possible to determine the functional relationship between the values of the control parameter and the desired values of the DOF. Using this functional relationship it is possible to calculate for each desired value of the DOF the associated control parameter for achieving the desired image quality.

Figure 15:
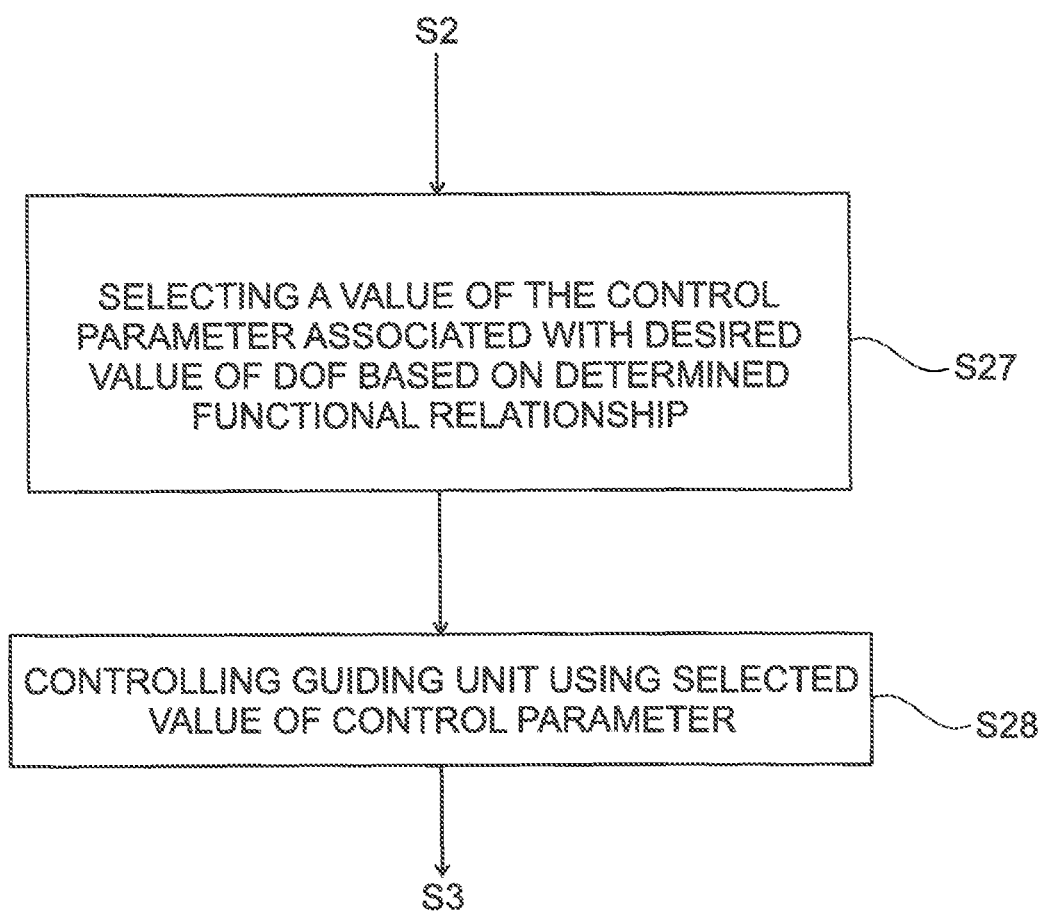
FIG. 15 shows a further embodiment of the method according to FIG. 8 comprising additional steps.

A further embodiment of the method according to FIG. 8 which is shown in FIG. 15 uses the determined functional relationship.

FIG. 15 shows additional steps of the method according to FIG. 8. In particular, the embodiment according to FIG. 15 additionally comprises method steps S27 and S28, both being carried out after method step S2 of the method according to FIG. 8.

In method step S27, a value of the control parameter associated with the desired value of the DOF based on the determined functional relationship is selected. Therefore, the value of the control parameter associated with the desired value of the DOF is selected using the determined functional relationship. In method step S28, at least one of the abovementioned guiding units are controlled using the selected value of the control parameter. After method step S28, method step S3 of the method according to FIG. 8 is carried out.

In a further embodiment of the method according to the invention, the determined functional relationship is used to determine each value of the control parameter associated with each value of the DOF. Moreover, each value of the control parameter determined with the functional relationship is stored in the control storage unit 901 associated with the corresponding value of the DOF. Those values of the control parameter may be used for the embodiment of the method according to FIG. 12.

As mentioned above, the method according to the invention may also be carried out with other particle beam devices, in particular the SEM 100 of FIG. 3, the particle beam device 200 of FIG. 5 and the particle beam device 300 of FIGS. 6 and 7. The method may be carried out using the single control unit 800 controlling several units as mentioned above.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

What is claimed is:

1. Method for generating an image of an object using a particle beam device that comprises a particle beam generator for generating a particle beam of charged particles, an objective lens for focusing the particle beam onto the object, a detector for detecting interaction particles and/or interaction radiation, the interaction particles and the interaction radiation arising from an interaction of the particle beam with the object when the particle beam impinges on the object, wherein the detector generates detection signals, a raster device for deflecting the particle beam over the object, a display unit for displaying the image of the object and/or of data of the object using the detection signals, and at least one of the following: (i) at least one condenser lens for guiding the particle beam in the particle beam device, (ii) at least one object holder for holding the object and (iii) at least one aperture unit comprising at least one aperture unit opening for forming and/or limiting the particle beam, the method comprising:
- selecting a desired value of a depth of field from a plurality of values of the depth of field by a user, wherein each value of the plurality of values of the depth of field is associated with a specific resolution of the particle beam device, the specific resolution being achieved when using the desired value of the depth of field,
- adjusting the depth of field to the desired value of the depth of field by controlling a relative position of the object to the objective lens, and
- imaging the object with the desired value of the depth of field and with the specific resolution associated with the value of the depth of field.

2. Method according to claim 1, further comprising:
- controlling the objective lens in such a way that the image of the object remains in focus when adjusting the depth of field to the desired value of the depth of field.

3. Method according to claim 2, the method further comprising:
- before adjusting the depth of field to the desired value of the depth of field, adjusting the raster device to achieve a first amount of deflection of the particle beam to obtain a specific magnification of the particle beam device, and
- after adjusting the depth of field to the desired value of the depth of field, adjusting the raster device to achieve a second amount of deflection of the particle beam to maintain the specific magnification of the particle beam device.

4. Method according to claim 2, the method further comprising:
- before adjusting the depth of field to the desired value of the depth of field, adjusting the raster device to achieve a specific rotation of the particle beam with respect to an optical axis of the particle beam device, and
- after adjusting the depth of field to the desired value of the depth of field, re-adjusting the raster device to maintain the specific rotation of the particle beam with respect to the optical axis of the particle beam device.

5. Method according to claim 2, wherein
the particle beam device further comprises at least one guiding unit for guiding the particle beam to the object, at least one control unit for controlling the guiding unit, and at least one storage unit comprising values of a control parameter for adjusting the control unit,
wherein the method comprises:
reading out of the storage unit a value of the control parameter associated with the desired value of a depth of field,
adjusting the control unit using the value of the control parameter, and controlling the guiding unit using the control unit.

6. Method according to claim 2, wherein
the particle beam device further comprises at least one guiding unit for guiding the particle beam to the object, at least one control unit for controlling the guiding unit by adjusting the control unit using a control parameter, wherein the method further comprises:
selecting a first desired value of a depth of field from the plurality of values of the depth of field by a user,
adjusting a first value of the control parameter for which a first image of the object with a desired image quality is obtained,
selecting a second desired value of a depth of field from the plurality of values of the depth of field by a user,
adjusting a second value of the control parameter for which a second image of the object with the desired image quality is obtained,
determining a functional relationship between the first value of the control parameter and the second value of the control parameter dependent on the plurality of values of the depth of field,
selecting a value of the control parameter associated with the desired value of the depth of field based on the determined functional relationship, and
controlling the guiding unit using the selected value of the control parameter.

7. Method according to claim 2, wherein the object holder is movable and wherein the relative position of the object to the objective lens is controlled by moving the object holder.

8. Method according to claim 2, wherein the aperture unit is movable and wherein the position of the aperture unit is controlled by moving the aperture unit.

9. Computer program product comprising a program code which is loaded into a processor and, which, when being executed, controls a particle beam device in such a way that a method according to claim 1 is carried out.

10. Method according to claim 1, the method further comprising:
- before adjusting the depth of field to the desired value of the depth of field, adjusting the raster device to achieve a first amount of deflection of the particle beam to obtain a specific magnification of the particle beam device, and
- after adjusting the depth of field to the desired value of the depth of field, adjusting the raster device to achieve a second amount of deflection of the particle beam to maintain the specific magnification of the particle beam device.

11. Method according to claim 1, the method further comprising:
- before adjusting the depth of field to the desired value of the depth of field, adjusting the raster device to achieve a specific rotation of the particle beam with respect to an optical axis of the particle beam device, and
- after adjusting the depth of field to the desired value of the depth of field, re-adjusting the raster device to maintain the specific rotation of the particle beam with respect to the optical axis of the particle beam device.

12. Method according to claim 1, wherein
the particle beam device further comprises at least one guiding unit for guiding the particle beam to the object, at least one control unit for controlling the guiding unit, and at least one storage unit comprising values of a control parameter for adjusting the control unit,
wherein the method comprises:
reading out of the storage unit a value of the control parameter associated with the desired value of a depth of field,
adjusting the control unit using the value of the control parameter, and controlling the guiding unit using the control unit.

13. Method according to claim 1, wherein
the particle beam device further comprises at least one guiding unit for guiding the particle beam to the object, at least one control unit for controlling the guiding unit by adjusting the control unit using a control parameter, wherein the method further comprises:
    selecting a first desired value of a depth of field from the plurality of values of the depth of field by a user,
    adjusting a first value of the control parameter for which a first image of the object with a desired image quality is obtained,
    selecting a second desired value of a depth of field from the plurality of values of the depth of field by a user,
    adjusting a second value of the control parameter for which a second image of the object with the desired image quality is obtained,
    determining a functional relationship between the first value of the control parameter and the second value of the control parameter dependent on the plurality of values of the depth of field,
    selecting a value of the control parameter associated with the desired value of the depth of field based on the determined functional relationship, and
    controlling the guiding unit using the selected value of the control parameter.

14. Method according to claim 1, wherein the object holder is movable and wherein the relative position of the object to the objective lens is controlled by moving the object holder.

15. Method according to claim 1, wherein the aperture unit is movable and wherein the position of the aperture unit is controlled by moving the aperture unit.

16. The method of claim 1, wherein the particle beam device is operated in an operation mode, and wherein the specific resolution is inherently to the operation mode.

17. Particle beam device for analyzing an object, comprising
    a particle beam generator for generating a particle beam having charged particles,
    an objective lens for focusing the particle beam onto the object,
    a raster device for deflecting the particle beam over the object,
    a detector for detecting interaction particles and/or interaction radiation, the interaction particles and the interaction radiation arising from interaction of the particle beam with the object when the particle beam impinges on the object, wherein the detector generates detection signals,
    a display unit for displaying an image of the object and/or of data of the object using the detection signals,
    at least one of the following: (i) at least one condenser lens for guiding the particle beam in the particle beam device, (ii) at least one object holder for holding the object and (iii) at least one aperture unit comprising at least one aperture unit opening for forming and/or limiting the particle beam, and
    a processor into which a computer program product according to claim 9 is loaded.

18. The particle beam device according to claim 17, further comprising a guiding unit for guiding the particle beam to the object.

19. The particle beam device according to claim 17, further comprising at least one of: (i) the object holder is movable, (ii) the aperture unit is movable and (iii) a size of the aperture unit opening is adjustable.

20. The particle beam device according to claim 17, wherein the particle beam generator is a first particle beam generator for generating a first particle beam having first charged particles, wherein the objective lens is a first objective lens for focusing the first particle beam onto the object, and wherein the particle beam device further comprises: a second particle beam generator for generating a second particle beam having second charged particles and a second objective lens for focusing the second particle beam onto the object.

21. The particle beam device according to claim 17, wherein the particle beam device is at least one of the following: an electron beam device and an ion beam device.

22. A method of generating an image of an object using a particle beam device that comprises a particle beam generator for generating a particle beam of charged particles, an objective lens for focusing the particle beam onto the object, a detector for detecting interaction particles and/or interaction radiation, the interaction particles and the interaction radiation arising from an interaction of the particle beam with the object when the particle beam impinges on the object, wherein the detector generates detection signals, a raster device for deflecting the particle beam over the object, a display unit for displaying the image of the object and/or of data of the object using the detection signals, and at least one of the following: (i) at least one condenser lens for guiding the particle beam in the particle beam device, (ii) at least one object holder for holding the object and (iii) at least one aperture unit comprising at least one aperture unit opening for forming and/or limiting the particle beam, the method comprising:
    selecting a desired value of a depth of field from a plurality of values of the depth of field by a user, wherein each value of the plurality of values of the depth of field is associated with a specific resolution of the particle beam device, the specific resolution being achieved when using the desired value of the depth of field,
    adjusting the depth of field to the desired value of the depth of field by controlling at least one of: (i) the condenser lens, (ii) a position of the aperture unit, and (iii) a size of the aperture unit opening, and
    imaging the object with the desired value of the depth of field and with the specific resolution associated with the value of the depth of field.

* * * * *